United States Patent
Matsui et al.

(10) Patent No.: US 10,976,382 B2
(45) Date of Patent: Apr. 13, 2021

(54) HOUSING AND MAGNETIC SENSOR DEVICE

(71) Applicant: Mitsubishi Electric Corporation, Chiyoda-ku (JP)

(72) Inventors: Hideki Matsui, Chiyoda-ku (JP); Tomokazu Ogomi, Chiyoda-ku (JP); Sadaaki Yoshioka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/466,831

(22) PCT Filed: Dec. 20, 2017

(86) PCT No.: PCT/JP2017/045761
§ 371 (c)(1),
(2) Date: Jun. 5, 2019

(87) PCT Pub. No.: WO2018/139123
PCT Pub. Date: Aug. 2, 2018

(65) Prior Publication Data
US 2019/0293729 A1    Sep. 26, 2019

(30) Foreign Application Priority Data
Jan. 25, 2017   (JP) .............................. JP2017-011235

(51) Int. Cl.
*G01R 33/02*   (2006.01)
*G07D 7/04*    (2016.01)
*G07D 7/00*    (2016.01)

(52) U.S. Cl.
CPC .............. *G01R 33/02* (2013.01); *G07D 7/00* (2013.01); *G07D 7/04* (2013.01)

(58) Field of Classification Search
CPC ........................ G01R 33/02; G01R 33/0076; G01R 33/0072; G07D 7/00; G07D 7/04
See application file for complete search history.

(56) References Cited

U.S. PATENT DOCUMENTS 5,063,347 A * 11/1991 Shigeno ................... G07D 7/04
                                                                324/235
2004/0165226 A1* 8/2004 Tomita ................. H04N 1/0318
                                                                358/474

(Continued)

FOREIGN PATENT DOCUMENTS

CN          1922504 A      2/2007
CN        103839320 A      6/2014

(Continued)

OTHER PUBLICATIONS

International Search Report dated Apr. 3, 2018, in PCT/JP2017/045761 filed on Dec. 20, 2017.

(Continued)

*Primary Examiner* — Huy Q Phan
*Assistant Examiner* — Adam S Clarke
(74) *Attorney, Agent, or Firm* — Oblon, McClelland, Maier & Neustadt, L.L.P.

(57) ABSTRACT

Even in a case in which a comb-teeth shape is provided at an end portion of a cover covering an opening in a magnetic shield case that accommodates a magnetic sensor, the present disclosure obtains a magnetic sensor device and a housing therefor capable of maintaining the strength of a comb-teeth portion. The magnetic sensor device and the housing therefor include: a comb-teeth portion in which protrusions are formed in the shape of comb teeth along an intersecting direction intersecting a conveying direction, the comb-teeth portion being formed at an end portion of a cover with respect to the conveying direction, the cover covering an opening in a magnetic shield case that accommodates a (Continued)

magnetic sensor; and support members formed on a lateral face of the magnetic shield case, the support members supporting the protrusions on the side opposite to the conveying path.

20 Claims, 24 Drawing Sheets

(56) References Cited

U.S. PATENT DOCUMENTS

| | | | |
|---|---|---|---|
| 2006/0279280 A1* | 12/2006 | Minamitani | G01R 33/09 |
| | | | 324/252 |
| 2015/0253803 A1* | 9/2015 | Weschke | G05G 1/44 |
| | | | 74/514 |
| 2015/0271936 A1* | 9/2015 | Stringer | G01D 11/30 |
| | | | 361/728 |
| 2015/0369882 A1 | 12/2015 | Mochizuki | |
| 2016/0148455 A1 | 5/2016 | Hata et al. | |
| 2017/0199253 A1 | 7/2017 | Okada et al. | |
| 2018/0313911 A1 | 11/2018 | Okada et al. | |
| 2019/0056461 A1 | 2/2019 | Matsui et al. | |
| 2019/0086245 A1* | 3/2019 | Kim | B60R 21/0136 |

FOREIGN PATENT DOCUMENTS

| | | | |
|---|---|---|---|
| JP | 59-44673 A | | 3/1984 |
| JP | 2001059860 A | * | 3/2001 |
| JP | 2004-317463 A | | 11/2004 |
| JP | 2014-119935 A | | 6/2014 |
| JP | 2017-111714 A | | 6/2017 |
| JP | 6316516 | | 4/2018 |
| WO | WO 03/084210 A1 | | 10/2003 |
| WO | WO 2014/156793 A1 | | 10/2014 |
| WO | WO 2015/045478 A1 | | 4/2015 |
| WO | WO 2016/013438 A1 | | 1/2016 |
| WO | WO 2017/169740 A1 | | 10/2017 |

OTHER PUBLICATIONS

Chinese Office action issued in Chinese Patent Application No. 201780083900.9 dated Dec. 1, 2020, (w/ English Translation).

* cited by examiner

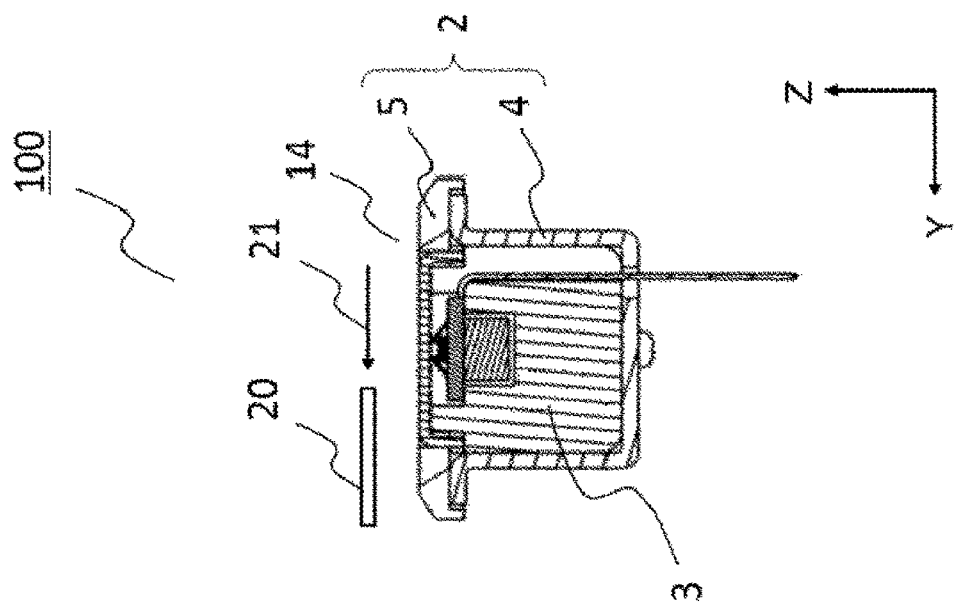
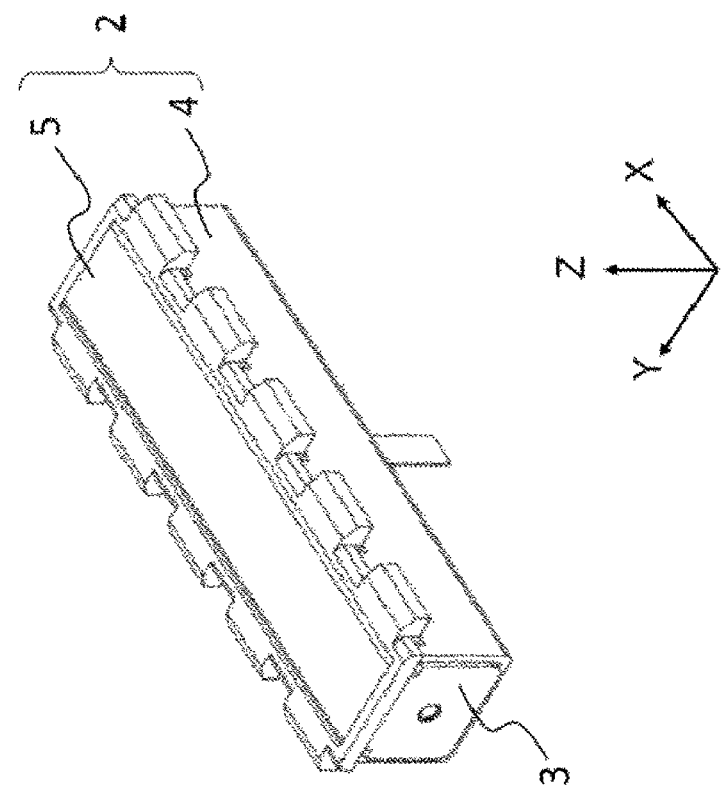

FIG. 3A
FIG. 3B
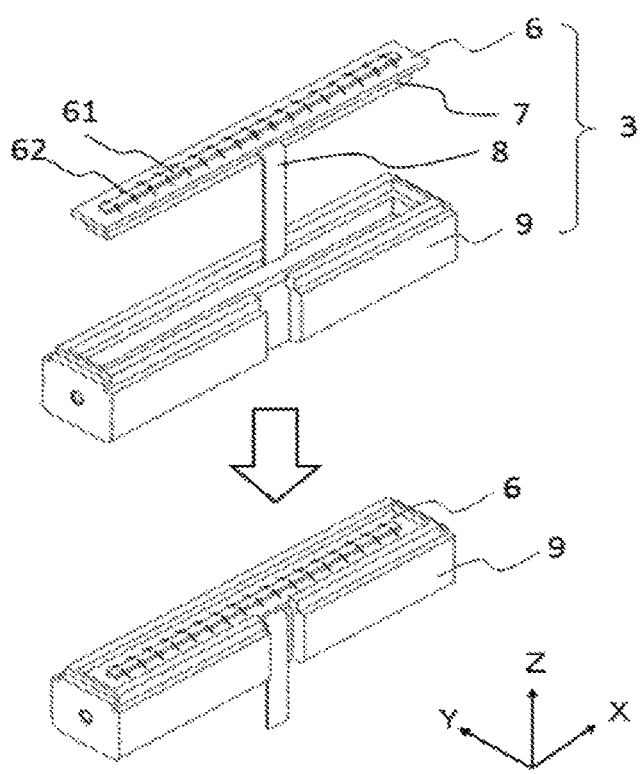
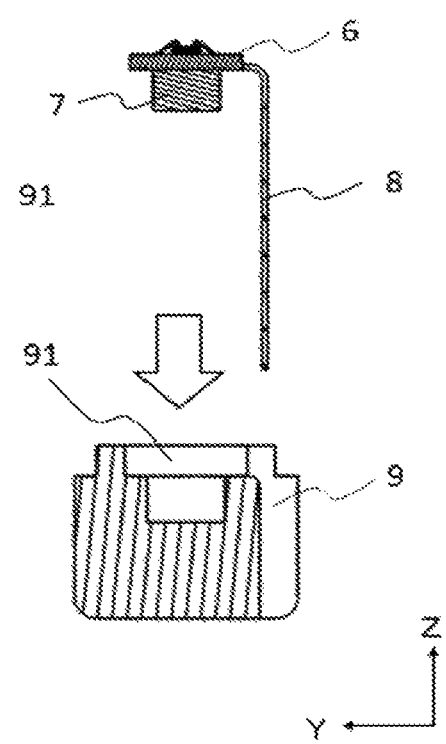

A — A

B — B

FIG. 9A
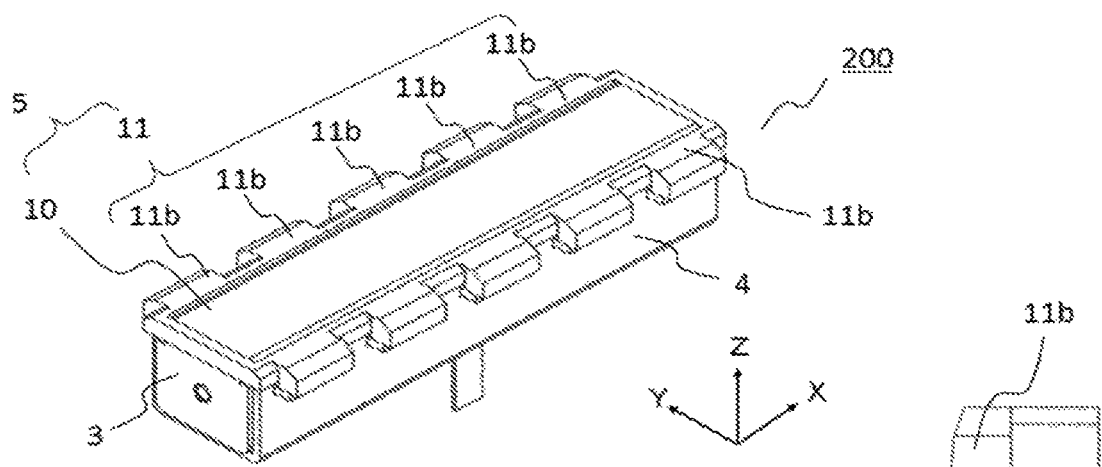
FIG. 9B
FIG. 9C
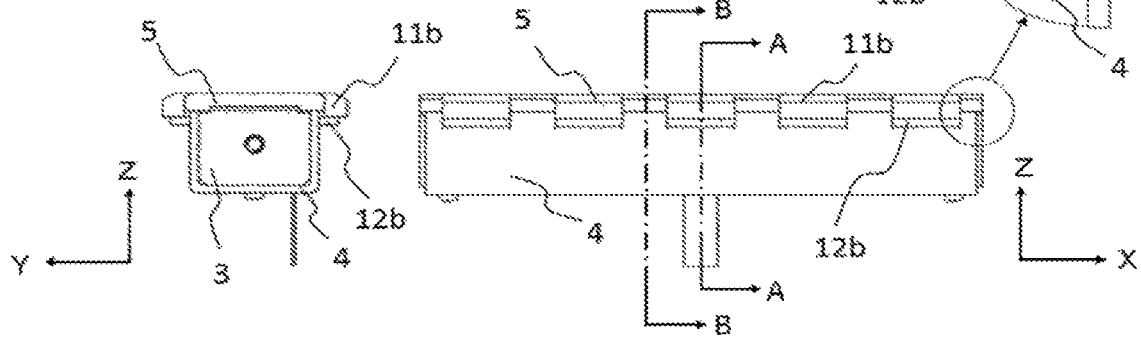

A — A

B — B

A — A

B — B

A — A

B — B

FIG. 20A
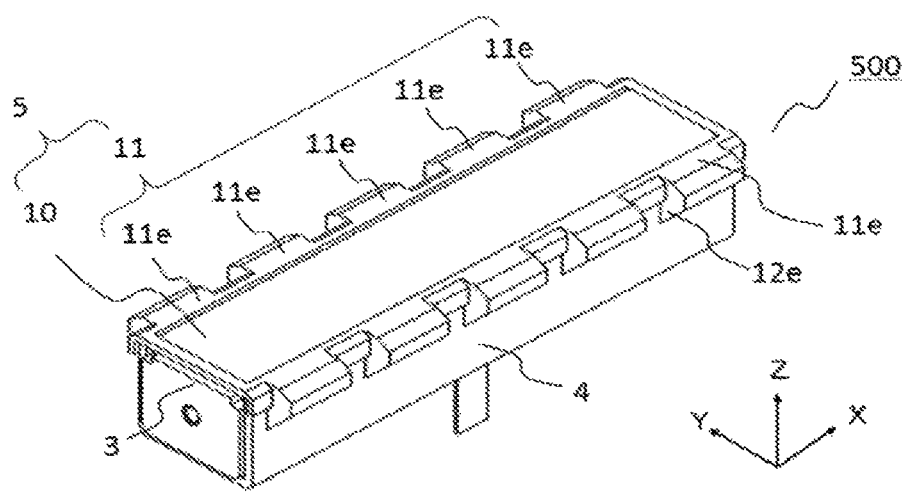
FIG. 20B
FIG. 20C
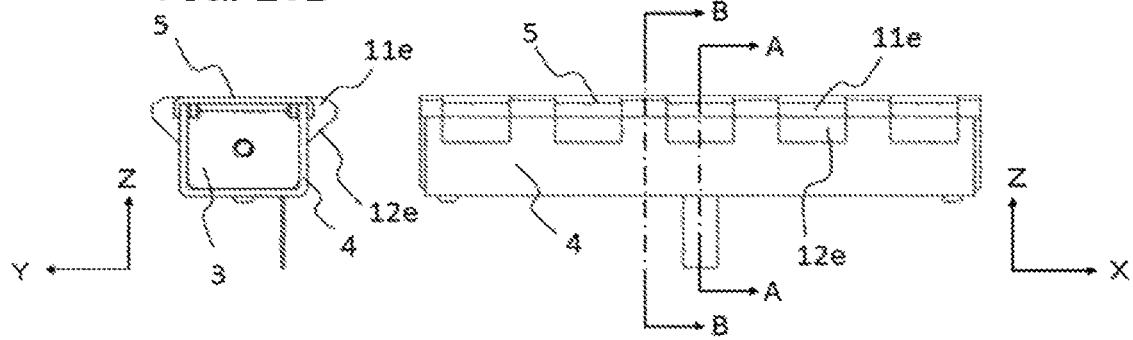

A—A

B — B

HOUSING AND MAGNETIC SENSOR DEVICE

CROSS-REFERENCE TO RELATED APPLICATIONS

This application is a United States national stage application of International Application No. PCT/JP2017/045761, filed Dec. 20, 2017, which designates the United States, and claims priority to Japan Patent Application No. 2017-011235, filed Jan. 25, 2017, and the entire contents of each of the above applications are hereby incorporated herein by reference in entirety.

TECHNICAL FIELD

The present disclosure relates to a magnetic sensor device that detects a magnetic component included in a sheet-like to-be-detected object and to a housing for the device.

BACKGROUND ART

In a device through which a sheet-like to-be-detected object, such as a paper currency, is conveyed, the to-be-detected object passing therethrough may enter and stuck in a gap in a joint on a conveying path if the to-be-detected object has a folded corner or is partly damaged. For this reason, some conventional devices prevent a to-be-detected object from being stuck by disposing protrusions in the shape of comb teeth engaged in a joint on a conveying path (see Patent Literature 1, for example).

Since a magnetic sensor device also has a joint placed along a conveying path, the magnetic sensor device may sometimes include a comb-teeth shape disposed in the joint. For example, Patent Literature 2 discloses a magnetic sensor and a bill validator that include a comb-teeth shape disposed in a joint. In the magnetic sensor and bill validator described in Patent Literature 2, protrusions in the shape of comb teeth are formed on a stage in the joint between the stage and the magnetic sensor on the conveying path. Each of the protrusions is fitted into each of recesses formed on the cover that is included in the magnetic sensor.

Patent Literature 3 discloses a magnetic sensor device that includes a cover for protecting a magneto-resistive element.

CITATION LIST

Patent Literature

Patent Literature 1: Unexamined Japanese Patent Application Kokai Publication No. 2014-119935
Patent Literature 2: Unexamined Japanese Patent Application Kokai Publication No. 2004-317463
Patent Literature 3: International Publication No. WO 2016/013438

SUMMARY OF INVENTION

Technical Problem

In general, to improve sensitivity of a magnetic sensor device, the cover is required to be made thinner and the magnetic sensor element for detecting a magnetic component is required to be disposed closer to the conveying surface on which a to-be-detected object is conveyed.

However, when a magnetic sensor device is configured such that protrusions are formed at an end portion of the cover of the magnetic sensor device with respect to the conveying direction as in Patent Literature 3, making the cover thinner is problematic in that there arises a concern about the strength of the comb-teeth portion. Also, in a case where the comb-teeth shape is provided as a separate part to be joined to the cover, a method for securely joining the comb-teeth portion is required since a concentrated stress is produced around the joint when a load is applied to the comb-teeth portion.

In order to solve the aforementioned problems, an objective of the present disclosure is to provide a magnetic sensor device and a housing therefor that are capable of maintaining the strength of a comb-teeth portion even if the comb-teeth portion is disposed on a cover.

Solution to Problem

A magnetic sensor device and a housing therefor according to the present disclosure comprise: a magnetic shield case including a space accommodating a magnetic sensor that comprises a magnetic sensor element to detect a magnetic component in a to-be-detected object to be conveyed along a conveying path, the magnetic shield case having the magnetic shield case opening that is open toward the conveying path; a cover supported by an end portion of the magnetic shield case with respect to a conveying direction of the to-be-detected object, the cover covering the magnetic shield case opening; a comb-teeth portion comprising protrusions at an end portion of the cover with respect to the conveying direction, the protrusions protruding toward the conveying direction and being aligned to form a shape of a comb-teeth along an intersecting direction intersecting the conveying direction; and a support member formed on a lateral face of the magnetic shield case along the intersecting direction, supporting the protrusion on the side opposite to the conveying path.

Advantageous Effects of Invention

A magnetic sensor device and a housing therefor according to the present disclosure provide the effect of maintaining the strength of a comb-teeth portion disposed on a cover by forming a support member even if the cover is made to be thinner.

BRIEF DESCRIPTION OF DRAWINGS

FIG. 1A is a perspective view of a magnetic sensor device according to Embodiment 1 of the present disclosure;

FIG. 1B is a cross-sectional view of the magnetic sensor device according to Embodiment 1 of the present disclosure;

FIG. 3A is a perspective view illustrating a process of assembling the magnetic sensor according to Embodiment 1 of the present disclosure;

FIG. 3B is a cross-sectional view illustrating the process of assembling the magnetic sensor according to Embodiment 1 of the present disclosure;

FIG. 9A is a perspective view of a magnetic sensor device according to Embodiment 2 of the present disclosure;

FIG. 9B is a side view of the magnetic sensor device according to Embodiment 2 of the present disclosure;

FIG. 9C is a side view of the magnetic sensor device according to Embodiment 2 of the present disclosure;

FIG. 20A is a perspective view of a magnetic sensor device according to Embodiment 5 of the present disclosure;

FIG. 20B is a side view of the magnetic sensor device according to Embodiment 5 of the present disclosure;

FIG. 20C is a side view of the magnetic sensor device according to Embodiment 5 of the present disclosure;

DESCRIPTION OF EMBODIMENTS

Figure 2:
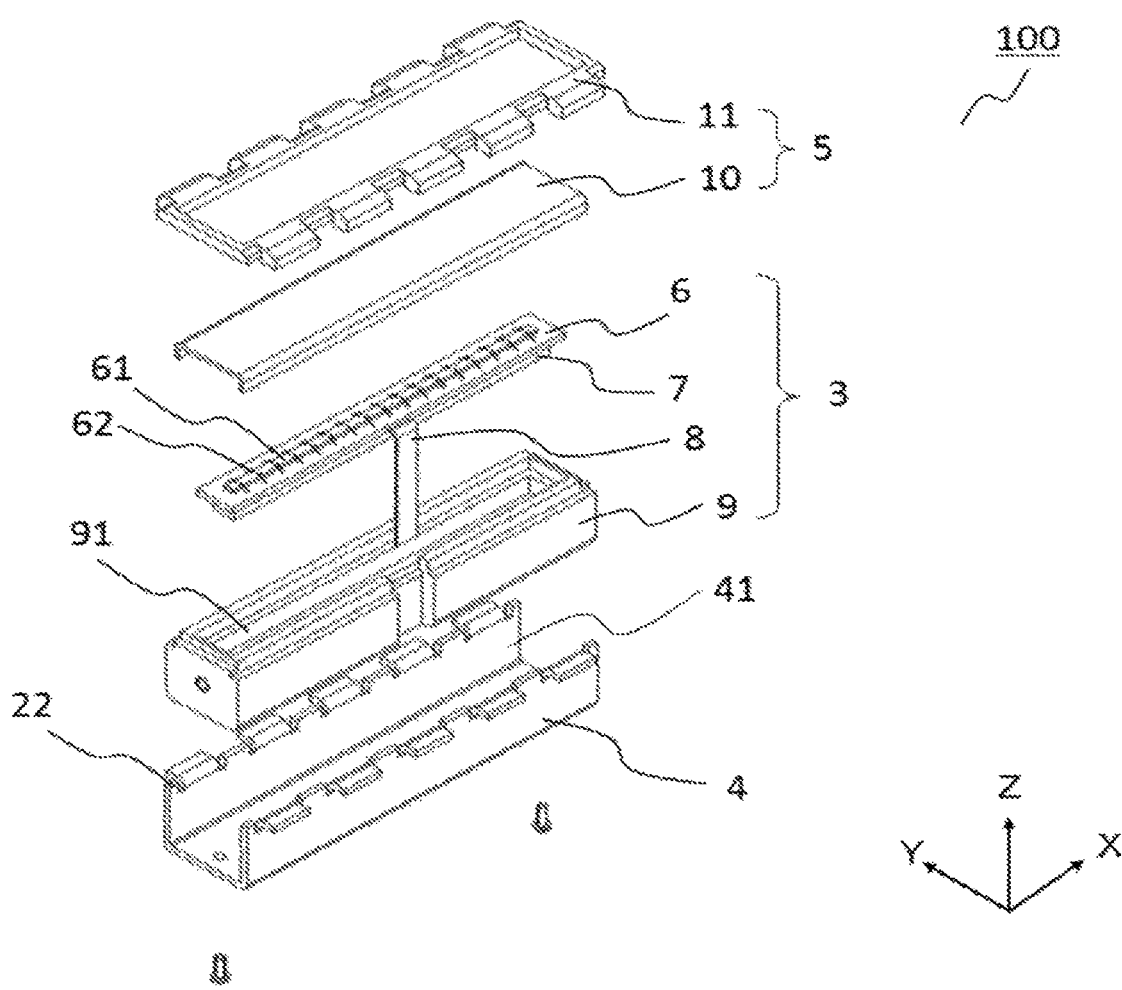
FIG. 2 is an exploded perspective view of the magnetic sensor device according to Embodiment 1 of the present disclosure.

Embodiments of the present disclosure are described in detail with reference to the drawings. In the drawings, components that are the same or equivalent are assigned the same reference signs.

Embodiment 1

FIG. 1A is a perspective view of a magnetic sensor device 100 according to Embodiment 1 of the present disclosure. FIG. 1B is a cross-sectional view of the magnetic sensor device 100 as seen from a longitudinal direction (main scanning direction) according to Embodiment 1 of the present disclosure. In the drawings, the longitudinal direction (main scanning direction) of the magnetic sensor device 100 is denoted as an X direction, a conveying direction in which a to-be-detected object 20 is conveyed is denoted as a Y direction, and a height direction of the magnetic sensor device 100 is denoted as a Z direction. As illustrated in FIG. 1A and FIG. 1B, the magnetic sensor device 100 according to Embodiment 1 includes a housing 2 and a magnetic sensor 3 according to Embodiment 1.

The housing 2 includes a magnetic shield case 4 and a cover 5. The magnetic shield case 4 includes a space provided therein to accommodate the magnetic sensor 3 that has a magnetic sensor element 61 (illustrated in FIG. 2). The magnetic shield case 4 has a magnetic shield case opening 41 (illustrated in FIG. 2) that is open toward a conveying path 14. The magnetic sensor element 61 detects a magnetic component contained in the to-be-detected object 20 such as a paper currency containing a magnetic element. The to-be-detected object 20 is conveyed in a conveying direction 21 by the conveying path 14 located on the cover 5-side of the magnetic sensor device 100. The cover 5, which is supported by an end portion 22 of the magnetic shield case 4 with respect to the conveying direction 21 for the to-be-detected object 20, covers the magnetic shield case opening 41. A face of the magnetic sensor device and housing that faces the conveying path 14 is hereinafter called a conveying surface.

FIG. 2 is an exploded perspective view of the magnetic sensor device 100 according to Embodiment 1 of the present disclosure. The magnetic sensor 3 includes a sensor board 6, a magnet 7, a connector 8, and a case 9.

The magnetic sensor 3 may be a line sensor or may be a point sensor. A line sensor includes a plurality of the magnetic sensor elements 61 that are arranged in a line in the longitudinal direction of the sensor board 6. A point sensor includes one or more magnetic sensor elements 61 placed on a portion of the sensor board 6 in the longitudinal direction. A line sensor is described as an example here. In the case of a line sensor, the direction along which the magnetic sensor elements 61 are arranged, which is the longitudinal direction, is called a main scanning direction. The longitudinal direction is parallel to the face of the conveying path 14 and intersects with the conveying direction 21.

On a face of the sensor board 6 that faces the conveying path 14, the magnetic sensor element 61 is electrically connected to the sensor board 6 via a wire 62. The magnetic sensor element 61 detects a change in a conveying direction component of the magnetic field caused by conveying the to-be-detected object 20 containing the magnetic component in the conveying direction 21. Examples of the magnetic sensor element 61 include an anisotropic magneto-resistive effect element (AMR), a tunnel magneto-resistive effect element (TMR), a giant magneto-resistive effect element (GMR), and a hall element.

On a face of the sensor board 6 opposite to the conveying path 14, the magnet 7 is attached all along the length of the sensor board 6 such that the magnet 7 extends in the main scanning direction. The magnet 7 creates a magnetic field. The connector 8 is disposed on a lateral face of the sensor board 6 with respect to the conveying direction 21. The connector 8 is a cable connecting the magnetic sensor 3 to an external device.

The case 9 consists of a frame body and includes a case opening 91 and a recess. The case opening 91 is an opening that is open toward the conveying path 14 to accommodate and hold the sensor board 6. The recess is formed to position the sensor board 6. FIG. 3A is a perspective view illustrating a process of assembling the magnetic sensor 3. FIG. 3B is a cross-sectional view illustrating the process of assembling the magnetic sensor 3 as seen from the main scanning direction. As illustrated in the drawings, a position of the sensor board 6 along the main scanning direction and the conveying direction are fixed by fitting the sensor board 6 into the recess in the case 9. A position of the sensor board 6 along the height direction is fixed by pressing the sensor board 6 against the face of the case 9 on the side of the conveying direction 21.

Figure 4A:
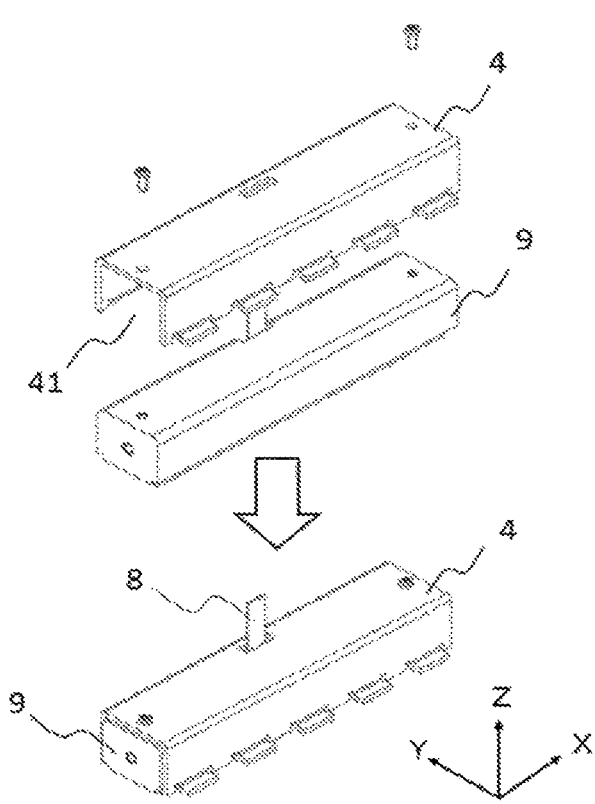
FIG. 4A is a perspective view illustrating a process of assembling the magnetic sensor device according to Embodiment 1 of the present disclosure.
Figure 4B:
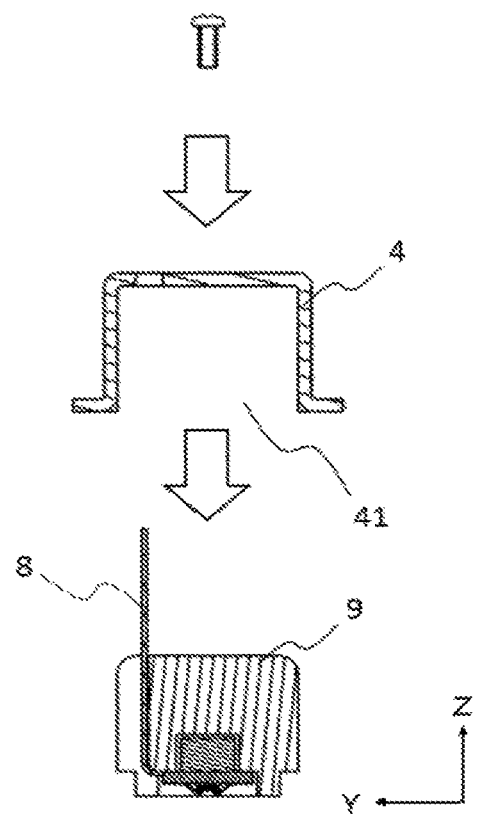
FIG. 4B is a cross-sectional view illustrating the process of assembling the magnetic sensor device according to Embodiment 1 of the present disclosure.

The magnetic shield case 4 includes the magnetic shield case opening 41 that is open toward the conveying path 14 to accommodate the magnetic sensor 3 therein. The magnetic shield case 4 is a case having shielding properties to reduce external magnetic interference (external disturbance noise). FIG. 4A is a perspective view illustrating a process of assembling the magnetic sensor device 100. FIG. 4B is a cross-sectional view illustrating the process of assembling the magnetic sensor device 100 as seen from the main scanning direction. As illustrated in these drawings, the magnetic shield case 4 is fastened to the case 9 by fastening means such as screws. Both the magnetic shield case 4 and the case 9 include positioning holes into which screws are to be inserted, where positioning holes is used for positioning the magnetic shield case 4 relative to the case 9. In this way, positions are fixed along the main scanning direction and the conveying direction. A position of the magnetic shield case 4 relative to the case 9 along the height direction is fixed by the screws fastening the magnetic shield case 4 and the case 9 together. An end portion of the connector 8 is led from a hole formed in the magnetic shield case 4 to the outside.

The cover 5 is a member forming the conveying surface for the to-be-detected object 20. The cover 5 extends along the main scanning direction on the conveying path 14-side of the magnetic sensor device 100 and covers both the case opening 91 and the magnetic shield case opening 41. In addition, the cover 5 is supported by the end portion 22 of the magnetic shield case 4 with respect to the conveying direction 21 for the to-be-detected object 20. The cover 5 is fixed in such a way that the cover 5 is fitted into a step portion formed in the case 9, whereby positions of the cover 5 along the main scanning direction and the conveying direction are fixed. The position of the cover 5 along the height direction is fixed by pressing an opposite-side face of the cover 5 against the conveying path 14-side face of the case 9, where the opposite-side face of the cover 5 is a face opposite to the face of the cover 5 facing the conveying path 14. The cover 5 is attached to the case 9, for example, with an adhesive. However, the cover 5 may be attached to the case 9 in another way.

The cover 5 plays the role of protecting the magnetic sensor device 100 against shock and wear that may be caused when the to-be-detected object 20 hits or rubs against the magnetic sensor device while being conveyed on the magnetic sensor device. A non-magnetic material is used so as not to affect the magnetic field. For example, the cover 5 is produced by bending a thin plate made of a metal such as aluminum or some austenitic stainless steels.

The above-described configuration allows the magnetic sensor device 100 to detect a change in the magnetic field caused by a magnetic component in the to-be-detected object 20 and to detect a magnetic pattern of the to-be-detected object 20.

Figure 5A:
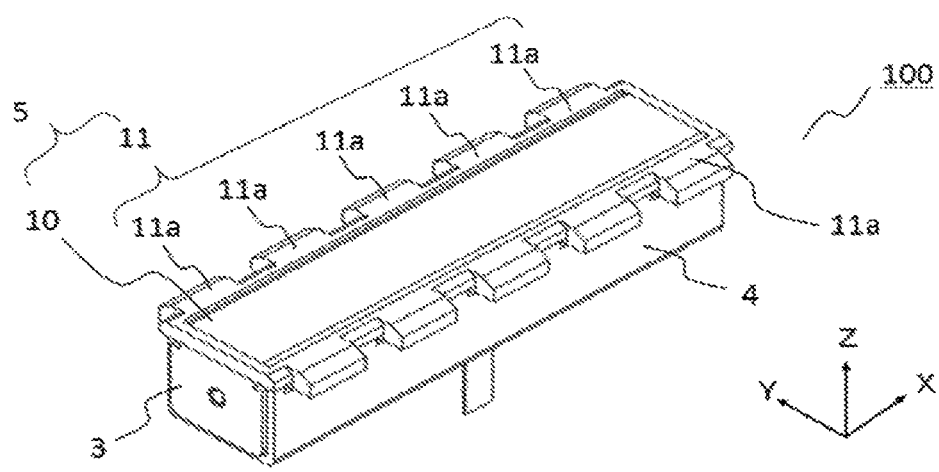
FIG. 5A is a perspective view of the magnetic sensor device according to Embodiment 1 of the present disclosure.
Figure 5B:
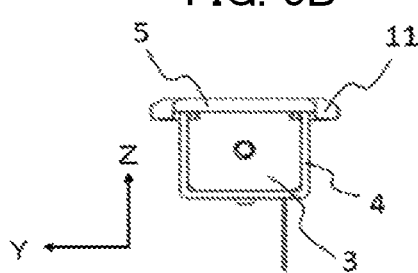
FIG. 5B is a side view of the magnetic sensor device according to Embodiment 1 of the present disclosure.
Figure 5C:
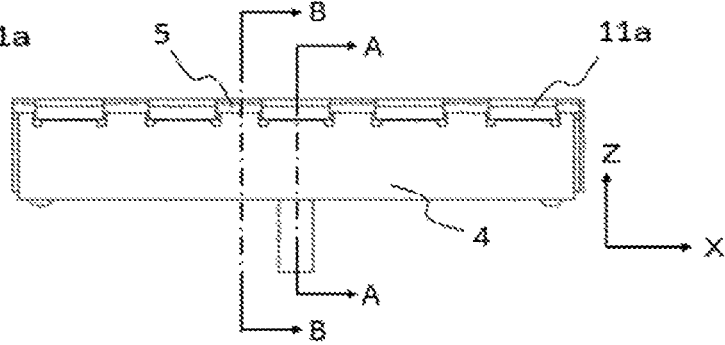
FIG. 5C is a side view of the magnetic sensor device according to Embodiment 1 of the present disclosure.

FIG. 5A is a perspective view of the magnetic sensor device 100 according to Embodiment 1. FIG. 5B is a side view of the magnetic sensor device 100 as seen from the main scanning direction according to Embodiment 1. FIG. 5C is a side view of the magnetic sensor device 100 as seen from the conveying direction 21 according to Embodiment 1. As illustrated in FIG. 5A, comb-teeth portions 11 are formed along the main scanning direction at end portions of the cover 5 with respect to the conveying direction 21. The comb-teeth portion 11 includes protrusions 11a protruding toward the conveying direction 21 and formed in the shape of comb-teeth along the main scanning direction. The cover 5 is formed by bonding the comb-teeth portions 11 made of a resin to a metal sheet 10. Examples of a bonding method include boding with an adhesive and integral molding by which the metal sheet 10 and the resin comb-teeth portions 11 are integrally molded. A gap between the metal sheet 10 and the comb-teeth portion 11 is filled with an adhesive or the like so as to have smooth surfaces. The comb-teeth portion 11 may be formed on both sides or one side of the cover 5 with respect to the conveying direction 21.

Figure 6:
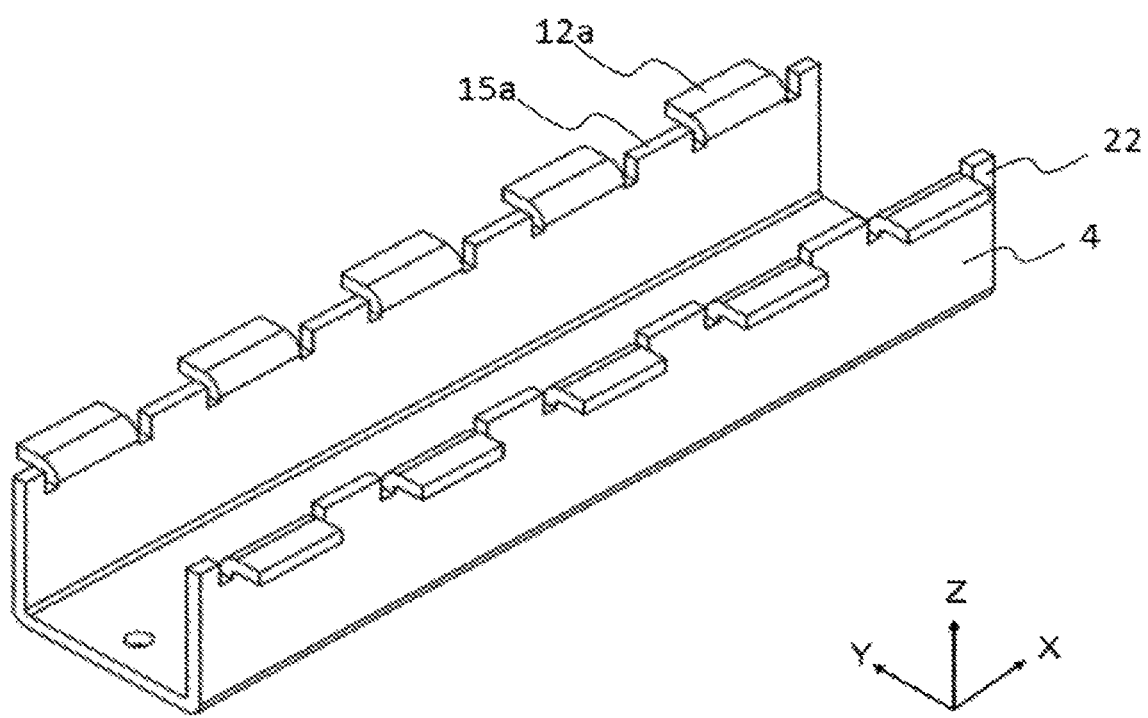
FIG. 6 is a perspective view of a magnetic shield case for the magnetic sensor device and a housing according to Embodiment 1 of the present disclosure.

FIG. 6 is a perspective view of the magnetic shield case 4 for the magnetic sensor device 100 and the housing 2 according to Embodiment 1. On a lateral face of the magnetic shield case 4 along the main scanning direction, support members 12a are formed so as to support the protrusions 11a on the side opposite to the conveying path 14. The support members 12a are formed at the end portions 22 of the magnetic shield case 4 with respect to the conveying direction 21. Each of the support members 12a is a member formed to project toward the conveying direction 21 to be suited to each of the protrusions 11a. The support members 12a and the magnetic shield case 4 are integrally formed.

Figure 7:
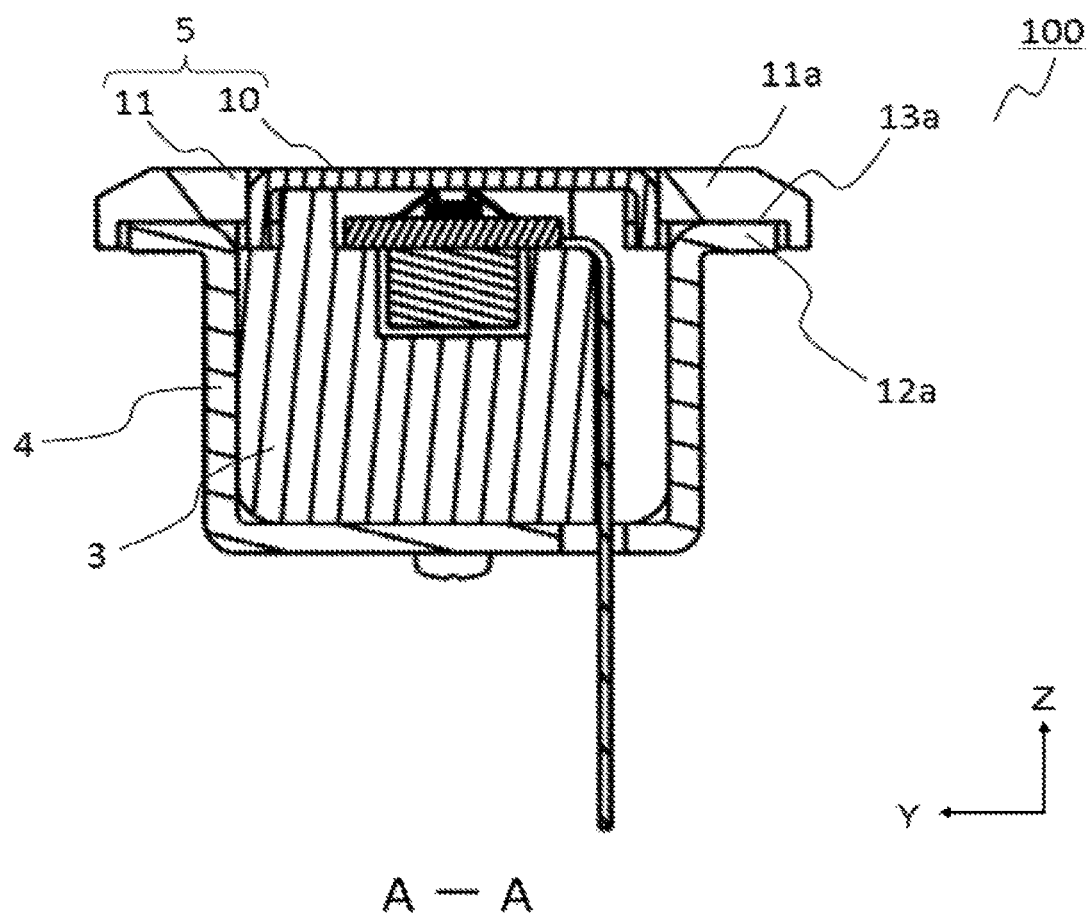
FIG. 7 is a cross-sectional view of a portion of the magnetic sensor device having comb-teeth portions according to Embodiment 1 of the present disclosure.

FIG. 7 is a cross-sectional view (taken along A-A in FIG. 5C) of a portion of the magnetic sensor device 100 having the comb-teeth portions 11 according to Embodiment 1, as seen from the main scanning direction. As illustrated in FIG. 7, first grooves 13a are formed in portions where the cover 5 and the support members 12a are in contact with each other, whereby the support members 12a are fitted into the first grooves 13a. Specifically, the first grooves 13a are formed on opposite-side faces of the protrusions 11a of the cover 5, where the opposite-side faces of the protrusions 11a are opposite to faces of the protrusions 11a facing the conveying path 14. In other words, the support members 12a are fitted into the first grooves 13a, which are formed in the protrusions 11a. As a result, the magnetic shield case 4 can be brought closer to the conveying surface, thereby reducing magnetic interference from a direction other than the direction of the conveying surface of the magnetic sensor 3.

Figure 8:
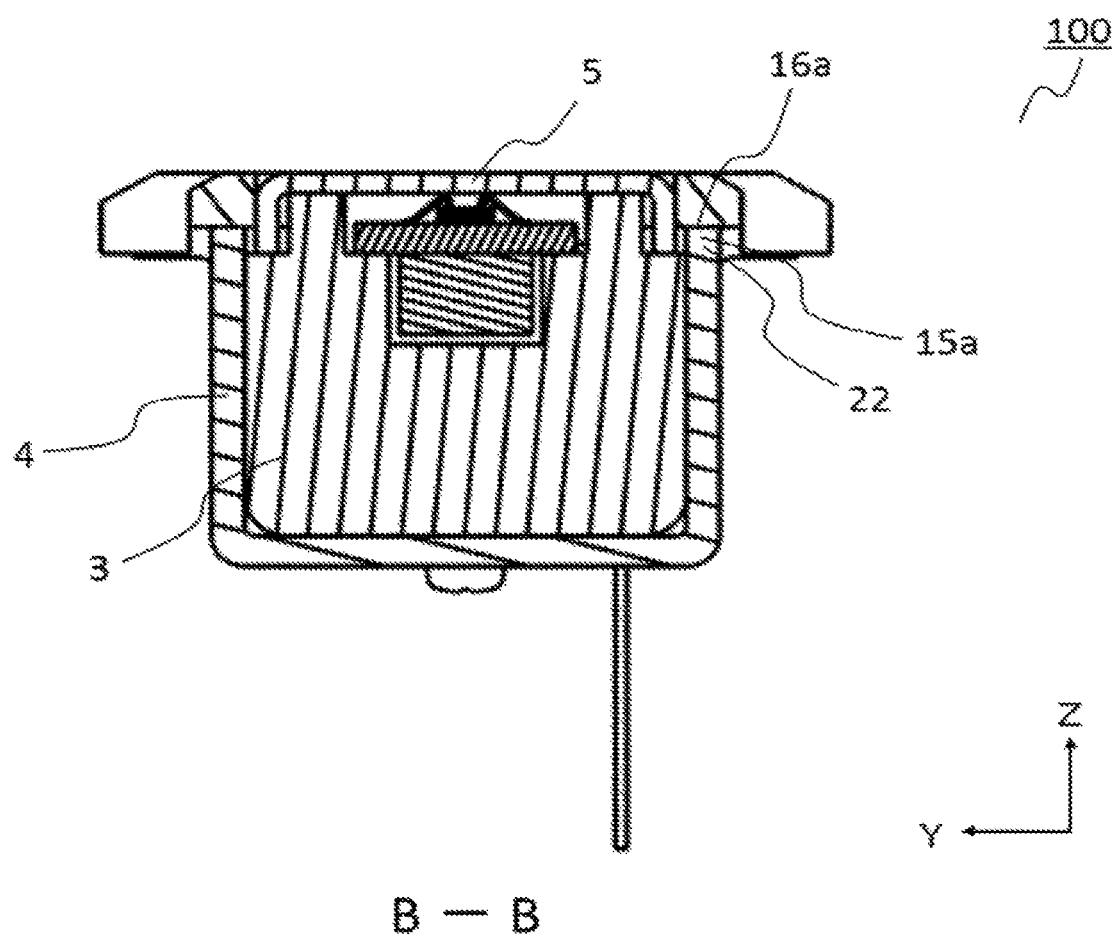
FIG. 8 is a cross-sectional view of a portion of the magnetic sensor device lacking the comb-teeth portions according to Embodiment 1 of the present disclosure.

FIG. 8 is a cross-sectional view (taken along B-B in FIG. 5C) of a portion of the magnetic sensor device 100 lacking the comb-teeth portions 11 according to Embodiment 1, as seen from the main scanning direction. At the end portions 22 of the magnetic shield case 4 with respect to the conveying direction 21, projections 15a are formed in portions where the support members 12a are not formed, the projections 15a projecting toward the conveying path 14 beyond the face of the support members 12a on the side of the conveying path 14. Second grooves 16a are formed in portions where the cover 5 and the projections 15a are in contact with each other, whereby the projections 15a are fitted into the second grooves 16a. As a result, the magnetic shield case 4 can be brought closer to the conveying surface even in a portion where the comb-teeth portion 11 is not present, thereby reducing magnetic interference from a direction other than the direction of conveying surface of the magnetic sensor 3.

The second grooves 16a and the projections 15a may not necessarily be provided. In this case, the portion where the support members 12a are not formed at the end portions 22 of the magnetic shield case 4 with respect to the conveying direction 21 is supported not by being fitted into the cover 5 but by being in contact with the cover 5.

In the magnetic sensor device 100 and the housing 2 according to Embodiment 1 of the present disclosure, the support members 12a of the magnetic shield case 4 are formed to be suited to the comb-teeth portions 11 so that the comb-teeth portions 11 are supported by the support members 12a, thereby increasing the strength of the comb-teeth portions 11. In addition, since the portion of the magnetic shield case 4 is fitted into the cover 5, the magnetic shield case 4 can be brought closer to the conveying surface, thereby reducing magnetic interference from a direction other than the direction of the conveying surface of the magnetic sensor 3.

Embodiment 2

In Embodiment 1, the support member is fitted into the first groove 13a in the cover 5. Embodiment 2 is different from Embodiment 1 in that the cover 5 does not include the first groove 13a and the support member is not fitted into the cover 5.

Figure 10:
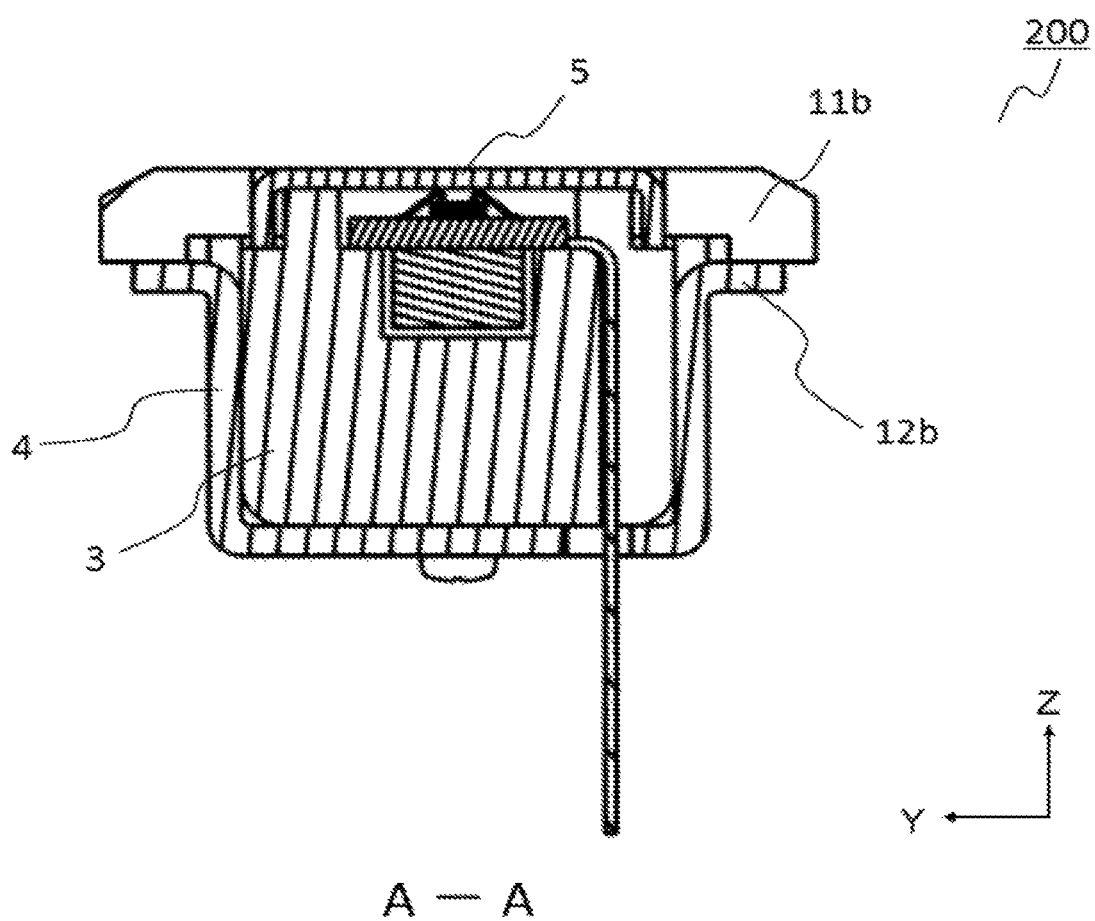
FIG. 10 is a cross-sectional view of a portion of the magnetic sensor device having comb-teeth portions according to Embodiment 2 of the present disclosure.

FIG. 9A is a perspective view of a magnetic sensor device 200 according to Embodiment 2. FIG. 9B is a side view of the magnetic sensor device 200 as seen from the main scanning direction according to Embodiment 2. FIG. 9C is a side view of the magnetic sensor device 200 as seen from the conveying direction 21 according to Embodiment 2. FIG. 10 is a cross-sectional view (taken along A-A in FIG. 9C) of a portion of the magnetic sensor device 200 having the comb-teeth portions 11 according to Embodiment 2, as seen from the main scanning direction. The cover 5 is supported by being in contact with the conveying path 14-side face of support members 12b. As illustrated in the enlarged view in FIG. 9C, the support members 12b are not fitted into protrusions 11b of the cover 5. This eliminates the need for creating, at the end portions 22 of the magnetic shield case 4 with respect to the conveying direction 21, a gap between the support member 12b and the adjacent portion where the support member 12b is not formed. As a result, the support members 12b can be made to have a length according to the length of the protrusions 11b relative to the main scanning direction.

Figure 11:
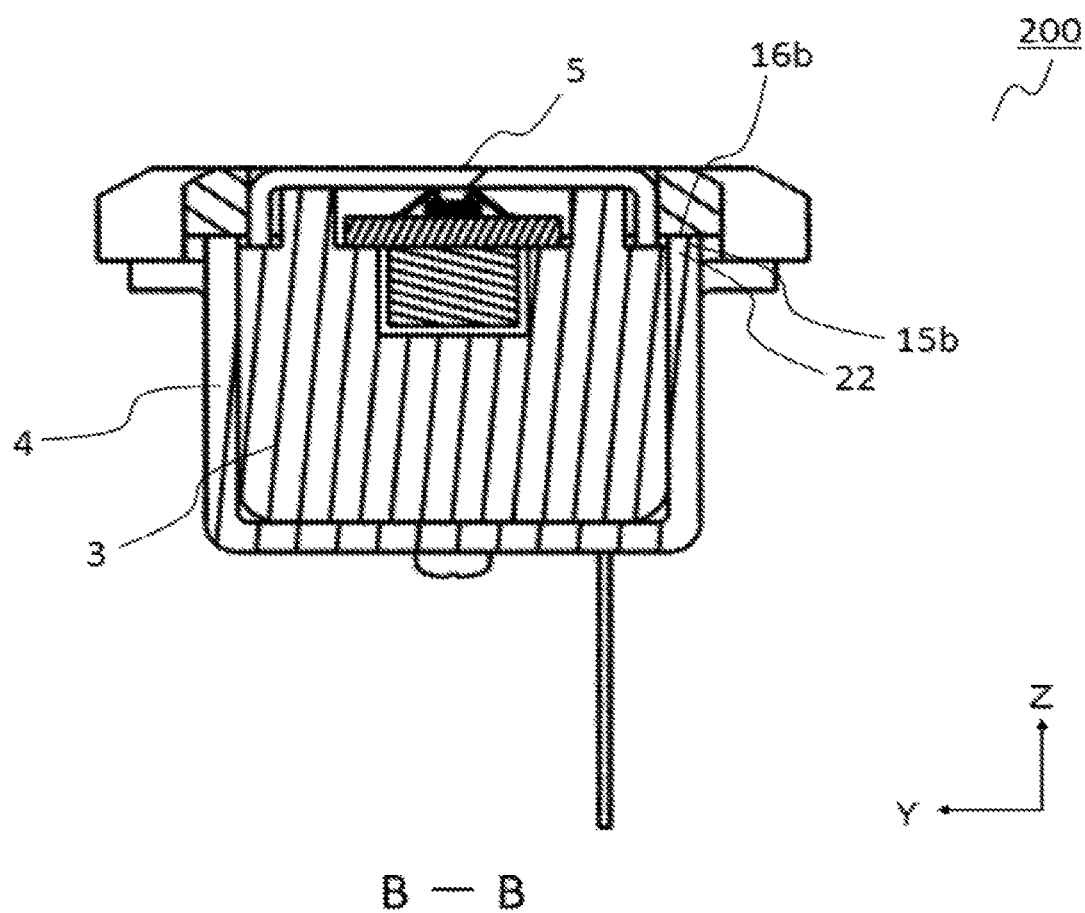
FIG. 11 is a cross-sectional view of a portion of the magnetic sensor device lacking the comb-teeth portions according to Embodiment 2 of the present disclosure.

FIG. 11 is a cross-sectional view (taken along B-B in FIG. 9C) of a portion of the magnetic sensor device 200 lacking the comb-teeth portions 11 according to Embodiment 2, as seen from the main scanning direction. At the end portions 22 of the magnetic shield case 4 with respect to the conveying direction 21, projections 15b are formed in a portion where the support members 12b are not formed, the projections 15b projecting toward the conveying path 14 beyond the conveying path 14-side face of the support members 12b. Second grooves 16b are formed in a portion where the cover 5 and the projections 15b are in contact with each other, whereby the projections 15b are fitted into the second grooves 16b. As a result, the magnetic shield case 4 can be brought closer to the conveying surface even in the portion lacking the comb-teeth portions 11, thereby reducing magnetic interference from a direction other than the direction of the conveying surface of the magnetic sensor 3.

The second grooves 16b and the projections 15b may not necessarily be provided. In this case, the portion where the support members 12b are not formed at the end portions 22 of the magnetic shield case 4 with respect to the conveying direction 21 is supported not by being fitted into the cover 5 but by being in contact with the cover 5.

The magnetic sensor device 200 and the housing 2 according to Embodiment 2 of the present disclosure eliminates the need for creating a gap between the support member and the adjacent portion where the support member is not formed. No gap is created between the support member and the adjacent portion where the support member is not formed in the magnetic shield case 4, thereby further improving the magnetic shielding effect.

Embodiment 3

In Embodiments 1 and 2, the cover 5 is formed by bonding the comb-teeth portions 11 made of a resin to the metal sheet 10. Embodiment 3 is different from Embodiments 1 and 2 in that the cover 5 is integrally formed.

Figure 12A:
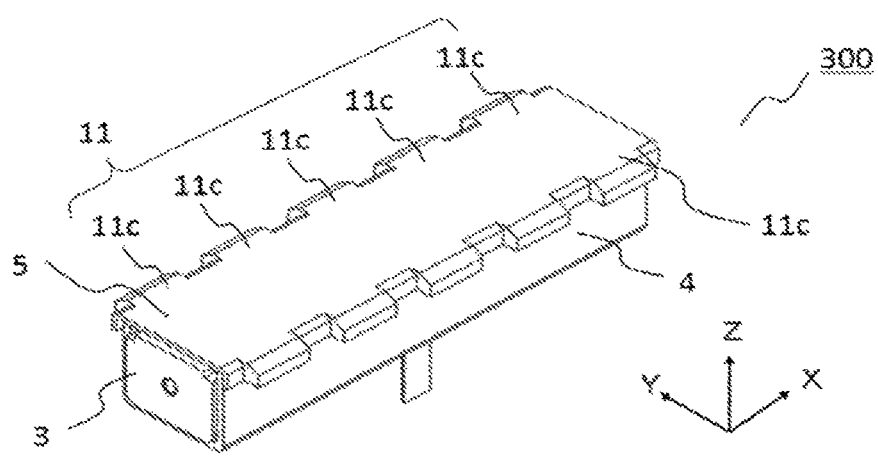
FIG. 12A is a perspective view of a magnetic sensor device according to Embodiment 3 of the present disclosure.
Figures 12B, 12C:
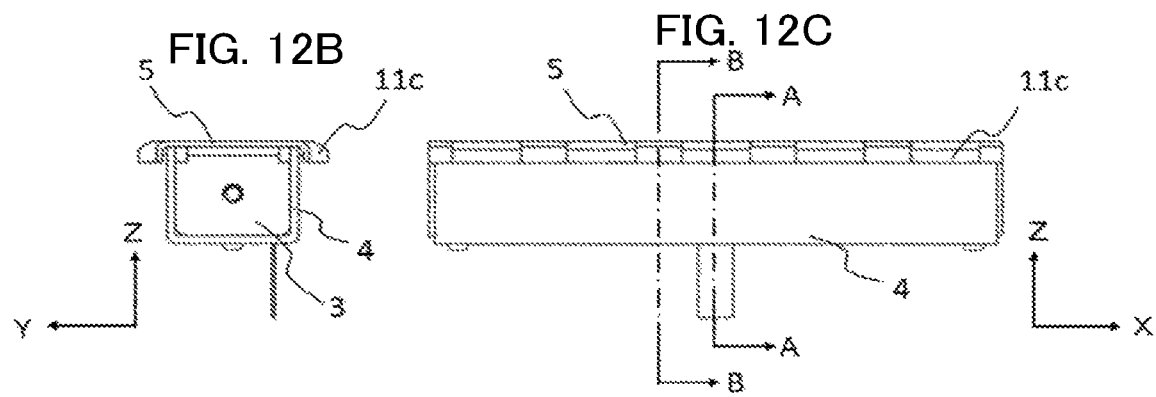
FIG. 12B is a side view of the magnetic sensor device according to Embodiment 3 of the present disclosure.
FIG. 12C is a side view of the magnetic sensor device according to Embodiment 3 of the present disclosure.
Figure 13A:
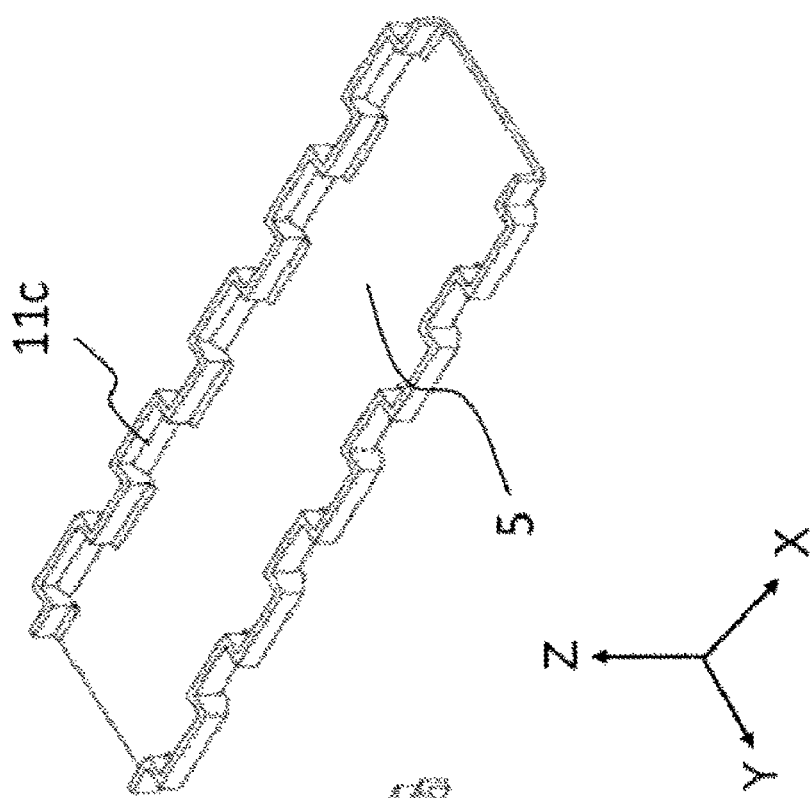
FIG. 13A is a perspective view of a cover for the magnetic sensor device and a housing according to Embodiment 3 of the present disclosure.
Figure 13B:
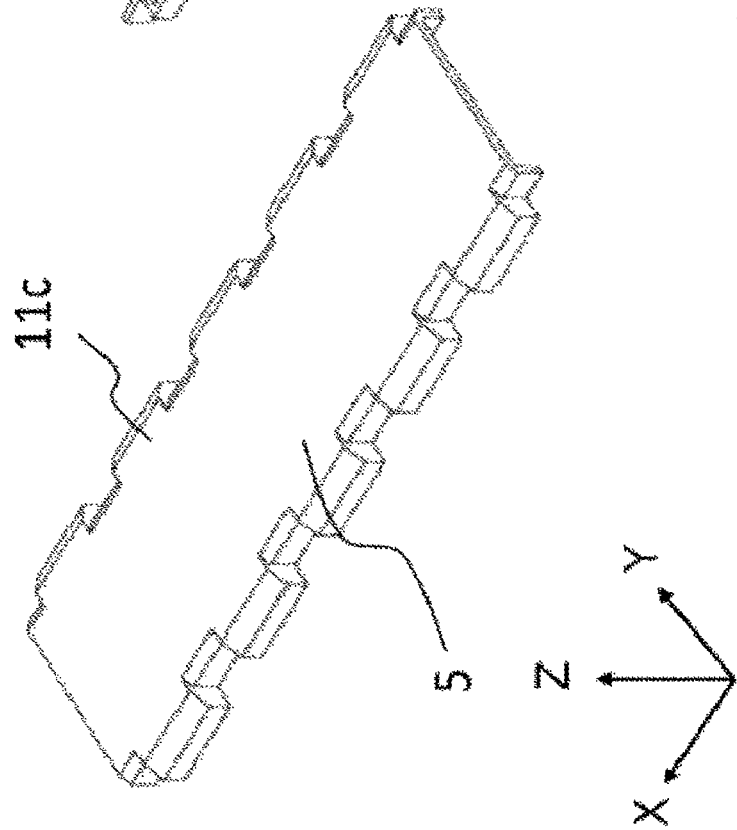
FIG. 13B is a perspective view of the cover for the magnetic sensor device and the housing according to Embodiment 3 of the present disclosure.

FIG. 12A is a perspective view of a magnetic sensor device 300 according to Embodiment 3. FIG. 12B is a side view of the magnetic sensor device 300 as seen from the main scanning direction according to Embodiment 3. FIG. 12C is a side view of the magnetic sensor device 300 as seen from the conveying direction 21 according to Embodiment 3. FIG. 13A is a perspective view of the front side of the cover 5 for the magnetic sensor device 300 and the housing 2 according to Embodiment 3, where the front side of the cover 5 corresponds to the conveying path 14-side. FIG. 13B is a perspective view of the back side of the cover 5 for the magnetic sensor device 300 and the housing 2 according to Embodiment 3, where the back side of the cover 5 corresponds to the side opposite to the conveying path 14. As illustrated in FIG. 13A and FIG. 13B, the cover 5 is a member formed by integrating the comb-teeth portions 11 with a portion covering the magnetic shield case opening 41. The comb-teeth portions 11 are formed along the main scanning direction at end portions of the cover 5 with respect to the conveying direction 21. The comb-teeth portion 11 includes protrusions 11c protruding toward the conveying direction 21 and the protrusions 11c form the shape of comb teeth along the main scanning direction. The cover 5 is made of a single metal sheet by, for example, using a drawing process. Hence, the conveying surface has no irregularities, thereby eliminating the need for a process of filling a gap with an adhesive or the like. Furthermore, the cover 5 can be made thinner. Therefore, the magnetic shield case 4 can be also extended closer to the conveying surface even in the portion having the comb-teeth portions 11 as in the case of the portion lacking the comb-teeth portions 11. The comb-teeth portion 11 may be formed on both sides or one side of the cover 5 with respect to the conveying direction 21.

Figure 14:
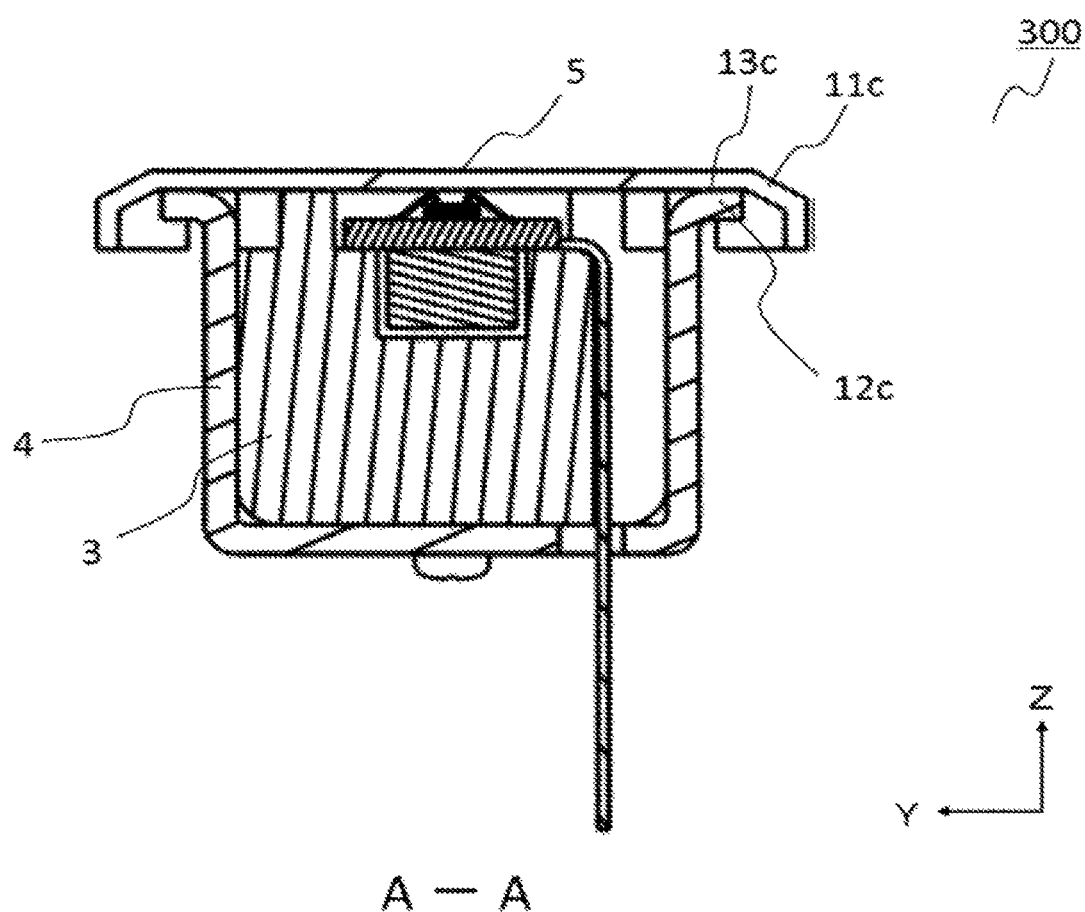
FIG. 14 is a cross-sectional view of a portion of the magnetic sensor device having comb-teeth portions according to Embodiment 3 of the present disclosure.
Figure 15:
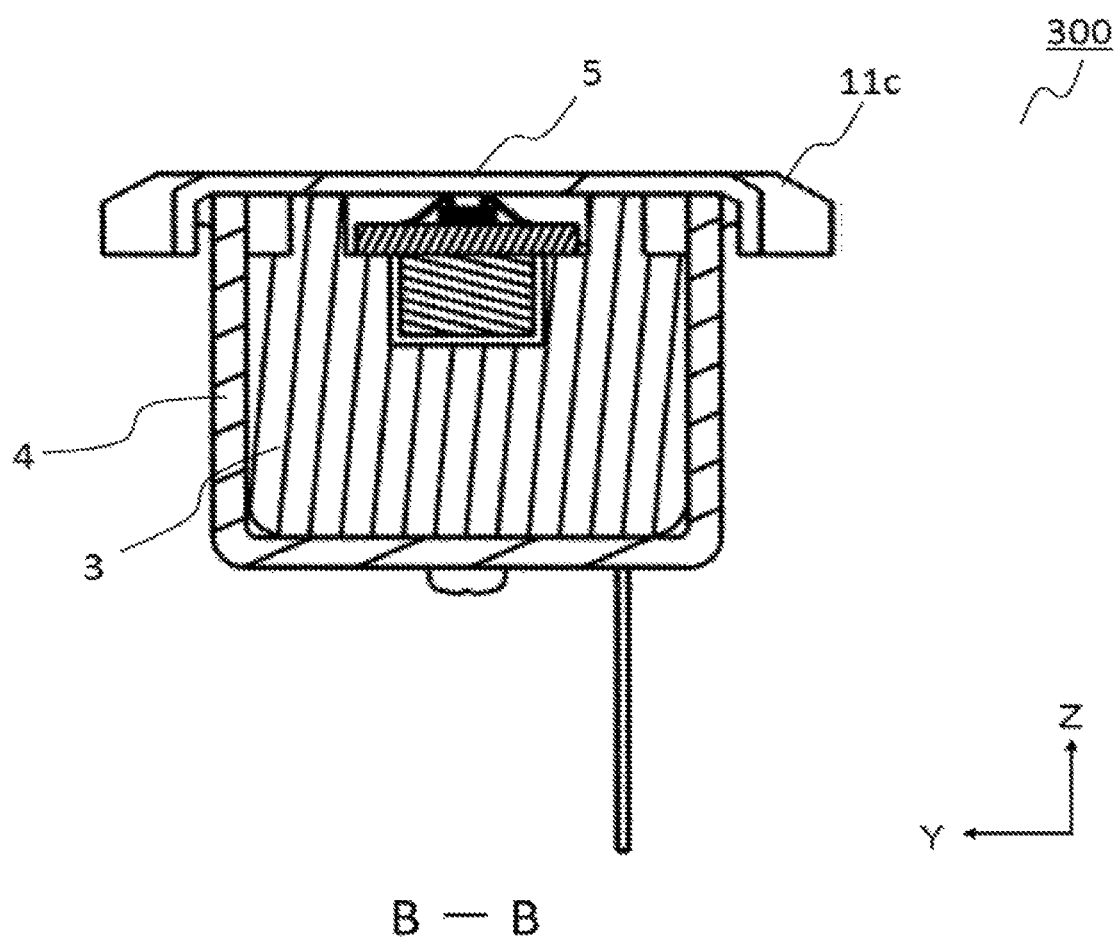
FIG. 15 is a cross-sectional view of a portion of the magnetic sensor device lacking the comb-teeth portions according to Embodiment 3 of the present disclosure.

FIG. 14 is a cross-sectional view (taken along A-A in FIG. 12C) of a portion of the magnetic sensor device 300 having the comb-teeth portions 11 according to Embodiment 3, as seen from the main scanning direction. FIG. 15 is a cross-sectional view (taken along B-B in FIG. 12C) of a portion of the magnetic sensor device 300 lacking the comb-teeth portions 11 according to Embodiment 3, as seen from the main scanning direction. As illustrated in FIG. 14, first grooves 13c are formed in portions of the cover 5 that are in contact with the support members 12c, whereby the support members 12c are fitted into the first grooves 13c. Specifically, the first grooves 13c are formed on opposite-side faces of the protrusions 11c in the cover 5, where the opposite-side faces of the protrusions 11c are opposite to the conveying path 14. In other words, the support members 12c are fitted into the first grooves 13c, which are formed in the protrusions 11c. As a result, the magnetic shield case 4 can be brought closer to the conveying surface, thereby reducing magnetic interference from a direction other than the direction of the conveying surface of the magnetic sensor 3.

The first grooves 13c may not necessarily be provided. In this case, the support members 12c are supported not by being fitted into the cover 5 but by being in contact with the cover 5.

In the magnetic sensor device 300 and the housing 2 according to Embodiment 3 of the present disclosure, the cover 5 is integrally formed, and thus the cover 5 can be easily produced. In addition, the cover 5 can be made thinner. Therefore, the magnetic shield case 4 can be extended closer to the conveying surface. Furthermore, there is no need for a process of filling a gap on the conveying surface with an adhesive or the like.

Embodiment 4

In Embodiments 1 to 3, the support members are formed to be suited to the comb-teeth portions 11. Embodiment 4 is different therefrom in that the support members are formed to extend along the main scanning direction.

Figure 16A:
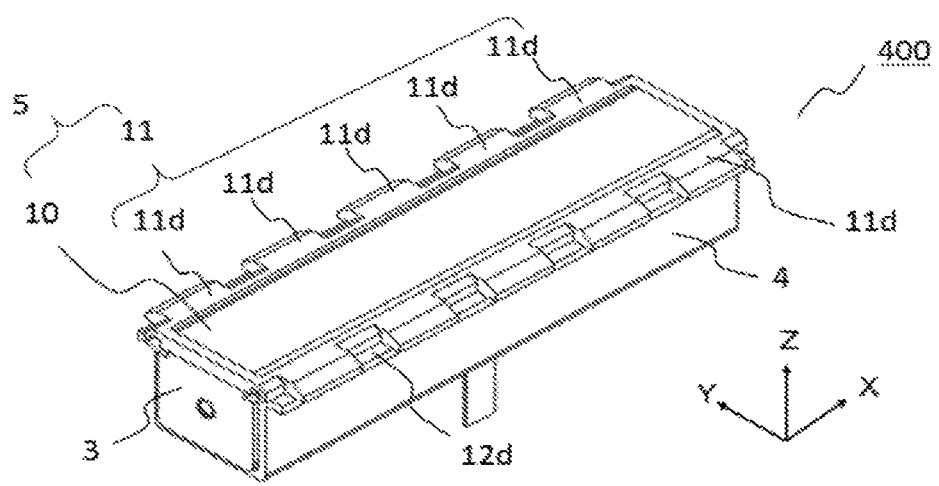
FIG. 16A is a perspective view of a magnetic sensor device according to Embodiment 4 of the present disclosure.
Figures 16B, 16C:
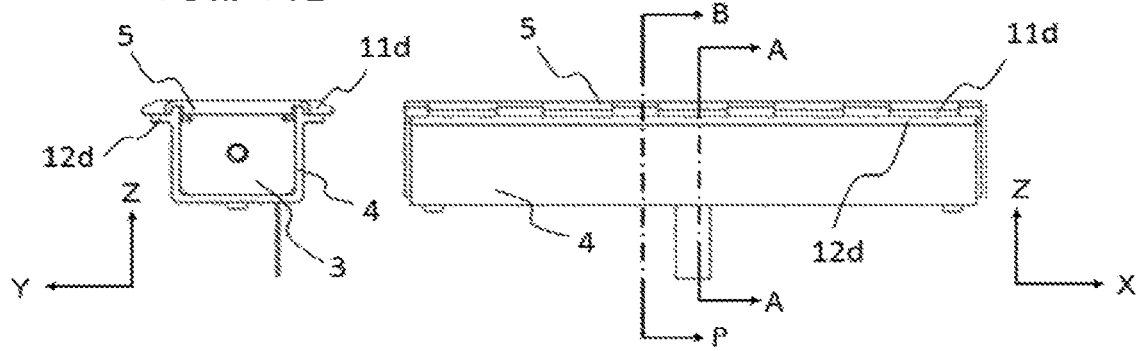
FIG. 16B is a side view of the magnetic sensor device according to Embodiment 4 of the present disclosure.
FIG. 16C is a side view of the magnetic sensor device according to Embodiment 4 of the present disclosure.
Figure 17:
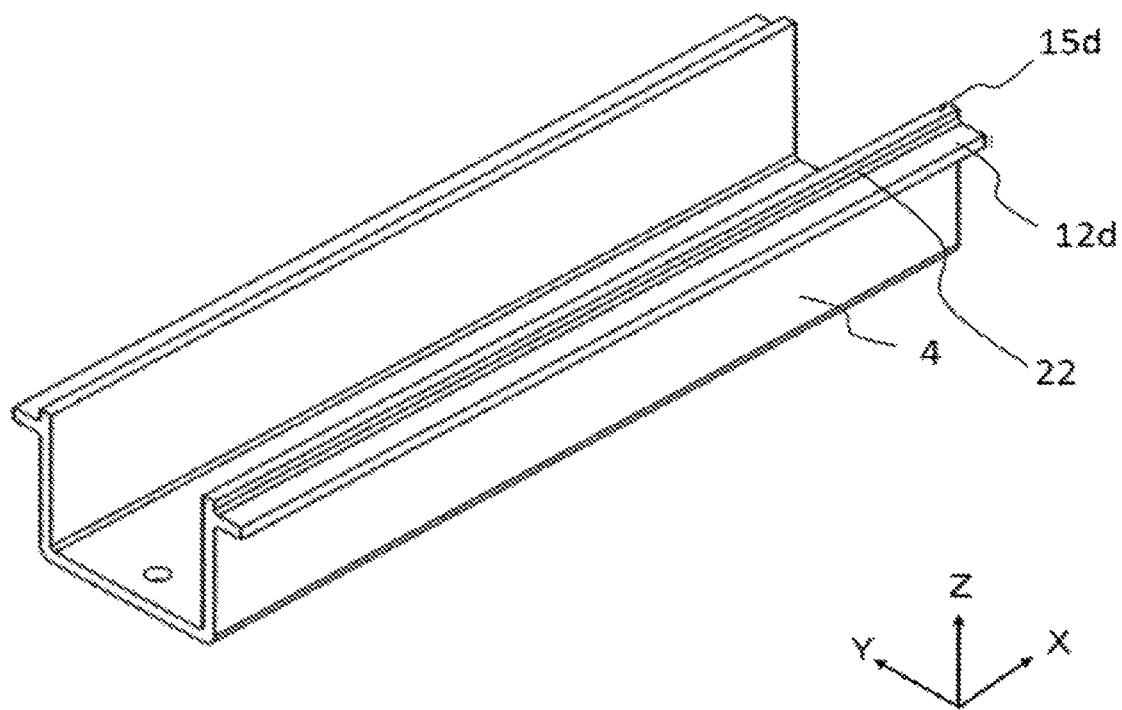
FIG. 17 is a perspective view of a magnetic shield case for the magnetic sensor device and a housing according to Embodiment 4 of the present disclosure.

FIG. 16A is a perspective view of a magnetic sensor device 400 according to Embodiment 4. FIG. 16B is a side view of the magnetic sensor device 400 as seen from the main scanning direction according to Embodiment 4. FIG. 16C is a side view of the magnetic sensor device 400 as seen from the conveying direction 21 according to Embodiment 4. FIG. 17 is a perspective view of the magnetic shield case 4 for the magnetic sensor device 400 and the housing 2 according to Embodiment 4. As illustrated in FIG. 17, on a lateral face of the magnetic shield case 4 along the main scanning direction, a support member 12d is formed to support protrusions 11d on the side opposite to the conveying path 14. At the end portions 22 of the magnetic shield case 4 with respect to the conveying direction 21, the support members 12d are formed to extend along the main scanning direction. The support members 12d and the magnetic shield case 4 are integrally formed.

Figure 18:
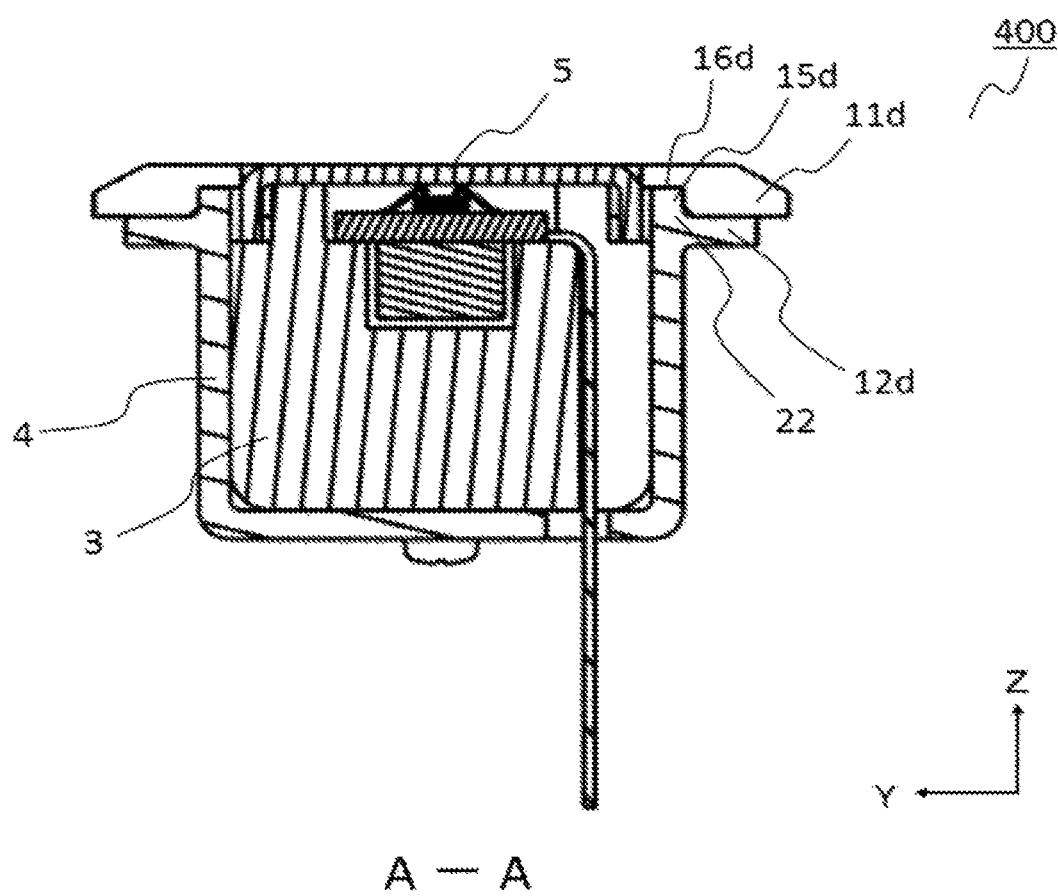
FIG. 18 is a cross-sectional view of a portion of the magnetic sensor device having comb-teeth portions according to Embodiment 4 of the present disclosure.
Figure 19:
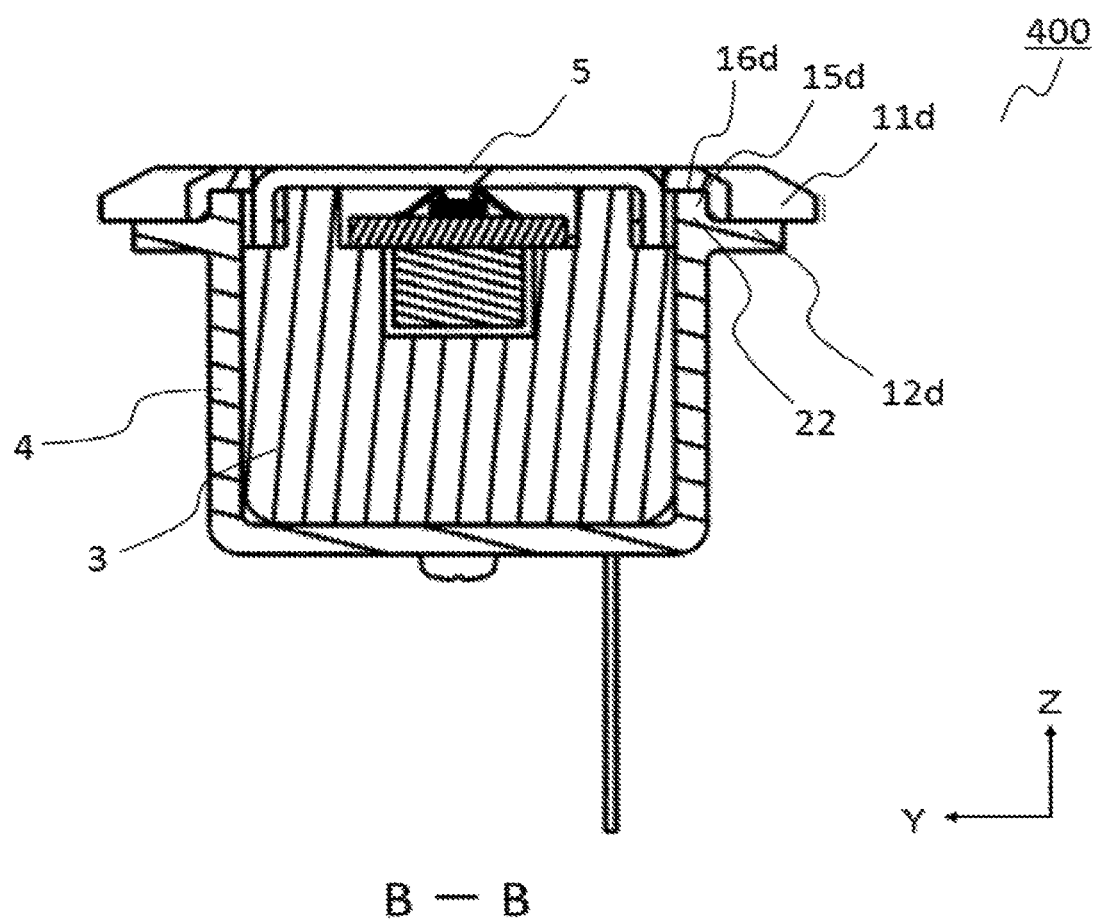
FIG. 19 is a cross-sectional view of a portion of the magnetic sensor device lacking the comb-teeth portions according to Embodiment 4 of the present disclosure.

FIG. 18 is a cross-sectional view (taken along A-A in FIG. 16C) of a portion of the magnetic sensor device 400 having the comb-teeth portions 11 according to Embodiment 4, as seen from the main scanning direction. FIG. 19 is a cross-sectional view (taken along B-B in FIG. 16C) of a portion of the magnetic sensor device 400 lacking the comb-teeth portions 11 according to Embodiment 4, as seen from the main scanning direction. As illustrated in the drawings, in addition to the support members 12d, at the end portions 22 of the magnetic shield case 4 with respect to the conveying direction 21, projections 15d are formed on the magnetic shield case 4 to extend along the main scanning direction and to project toward the conveying path 14 beyond the conveying path 14-side face of the support members 12d. Second grooves 16d are formed in portions of the cover 5 that are in contact with the projections 15d, whereby the projections 15d are fitted into the second grooves 16d. As a result, the magnetic shield case 4 can be brought closer to the conveying surface, thereby reducing magnetic interference from a direction other than the direction of the conveying surface of the magnetic sensor 3.

The second grooves and the projections 15d may not necessarily be provided. In this case, the end portions 22 of the magnetic shield case 4 with respect to the conveying direction 21 are supported not by being fitted into the cover 5 but by being in contact with the cover 5.

The support members 12d may be fitted into the comb-teeth portions 11. In this case, first grooves 13d are formed in portions where the cover 5 and the support members 12d are in contact with each other, whereby the support members 12d are fitted into the first grooves 13d. Specifically, the first grooves 13d are formed on opposite-side faces of the protrusions 11d in the cover 5, where the opposite-side faces of the protrusions 11d are opposite to the conveying path 14. In other words, the support members 12d are fitted into the first grooves 13d that are formed in the protrusions 11d. As a result, the magnetic shield case 4 can be brought closer to the conveying surface, thereby reducing magnetic interference from a direction other than the direction of the conveying surface of the magnetic sensor 3.

In the magnetic sensor device 400 and the housing 2 according to Embodiment 4 of the present disclosure, the support members 12d are formed to extend along the main scanning direction, thereby making it easy to form the magnetic shield case 4.

Embodiment 5

The support members described in Embodiment 5 are formed integrally with the comb-teeth portions 11 of the cover 5.

Figure 21:
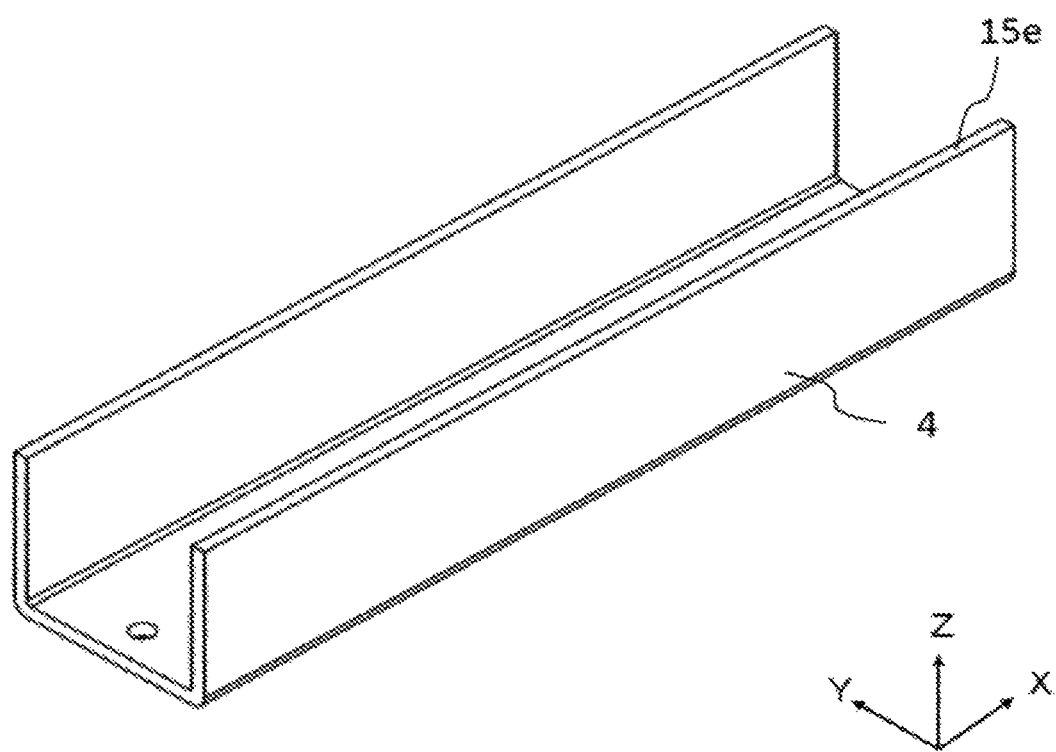
FIG. 21 is a perspective view of a magnetic shield case for the magnetic sensor device and a housing according to Embodiment 5 of the present disclosure.

FIG. 20A is a perspective view of a magnetic sensor device 500 according to Embodiment 5. FIG. 20B is a side view of the magnetic sensor device 500 as seen from the main scanning direction according to Embodiment 5. FIG. 20C is a side view of the magnetic sensor device 500 as seen from the conveying direction 21 according to Embodiment 5. As illustrated in FIG. 20A, the comb-teeth portions 11 are formed, along the main scanning direction, at end portions of the cover 5 with respect to the conveying direction 21. The comb-teeth portion 11 includes protrusions 11e protruding toward the conveying direction 21 and the protrusions 11e form the shape of comb teeth along the main scanning direction. The cover 5 is formed by bonding the comb-teeth portions 11 made of a resin to the metal sheet 10. Examples of a bonding method include boding with an adhesive and integral molding by which the metal sheet 10 and the resin comb-teeth portions 11 are integrally molded. A drawing process, for example, may also be used for the forming from a single metal sheet. The comb-teeth portion 11 may be formed on both sides or one side of the cover 5 with respect to the conveying direction 21. FIG. 21 is a perspective view of the magnetic shield case 4 for the magnetic sensor device 500 and the housing 2 according to Embodiment 5. As illustrated in FIG. 21, the support member is not formed integrally with the magnetic shield case 4.

Figure 22:
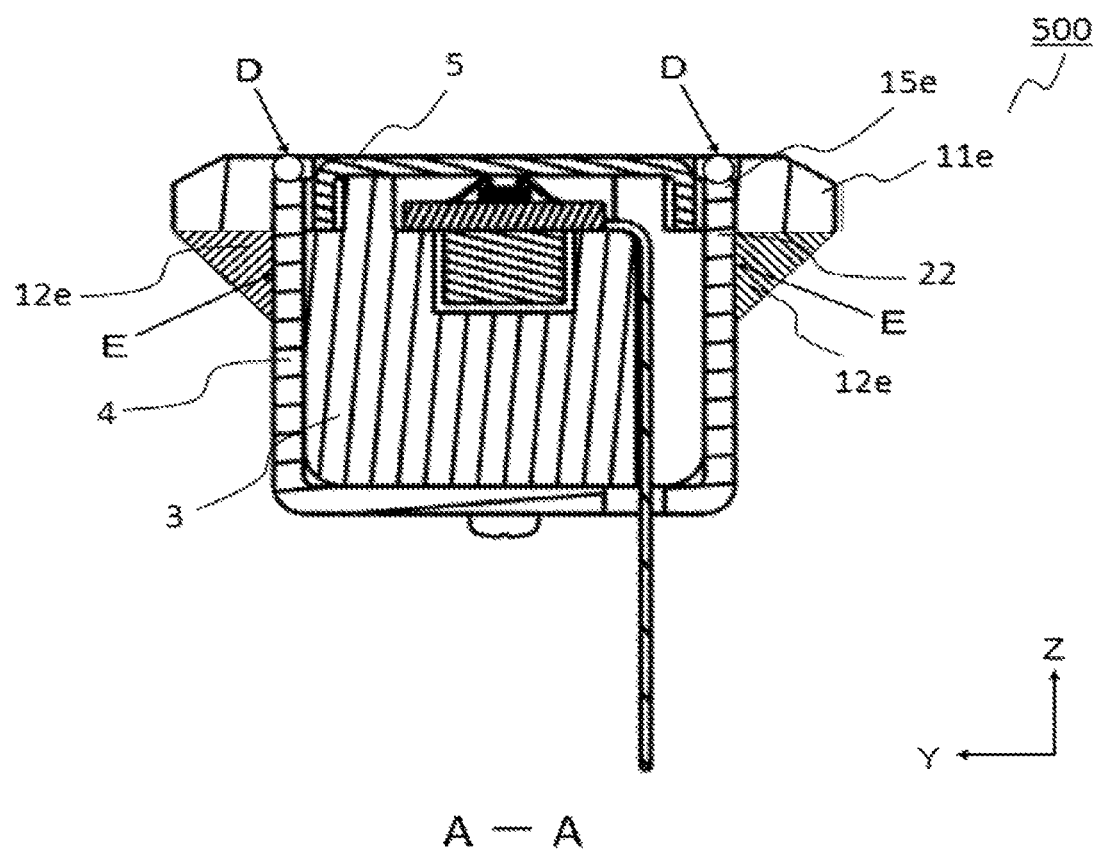
FIG. 22 is a cross-sectional view of a portion of the magnetic sensor device having comb-teeth portions according to Embodiment 5 of the present disclosure.

FIG. 22 is a cross-sectional view (taken along A-A in FIG. 20C) of a portion of the magnetic sensor device 500 having the comb-teeth portion 11 according to Embodiment 5, as seen from the main scanning direction. As illustrated in the drawing, support members 12e are formed on opposite-side faces of the protrusions 11e to support the protrusions 11e on the side opposite to the conveying path 14, where the opposite-side faces of the protrusions 11 are opposite to the conveying path 14. The support members 12e are in contact with the end portions 22 of the magnetic shield case 4 with respect to the conveying direction 21. The support member 12e is a member formed on a lateral face of the magnetic shield case 4 along the main scanning direction to be suited to the protrusion 11e such that the support member 12e projects toward a direction opposite to the conveying path 14. In this case, the support members 12e are formed so as to be in contact with the magnetic shield case 4, and the support members 12e are not integrated with the magnetic shield case 4 but are formed integrally with the protrusions 11e. Owing to such configuration, when a force is applied to the comb-teeth portion 11 from the direction of the conveying path 14, a rotational moment is produced with the point of contact D between the cover 5 and the magnetic shield case 4 serving as a fulcrum, and the comb-teeth portion 11 is supported on the plane E.

Figure 23:
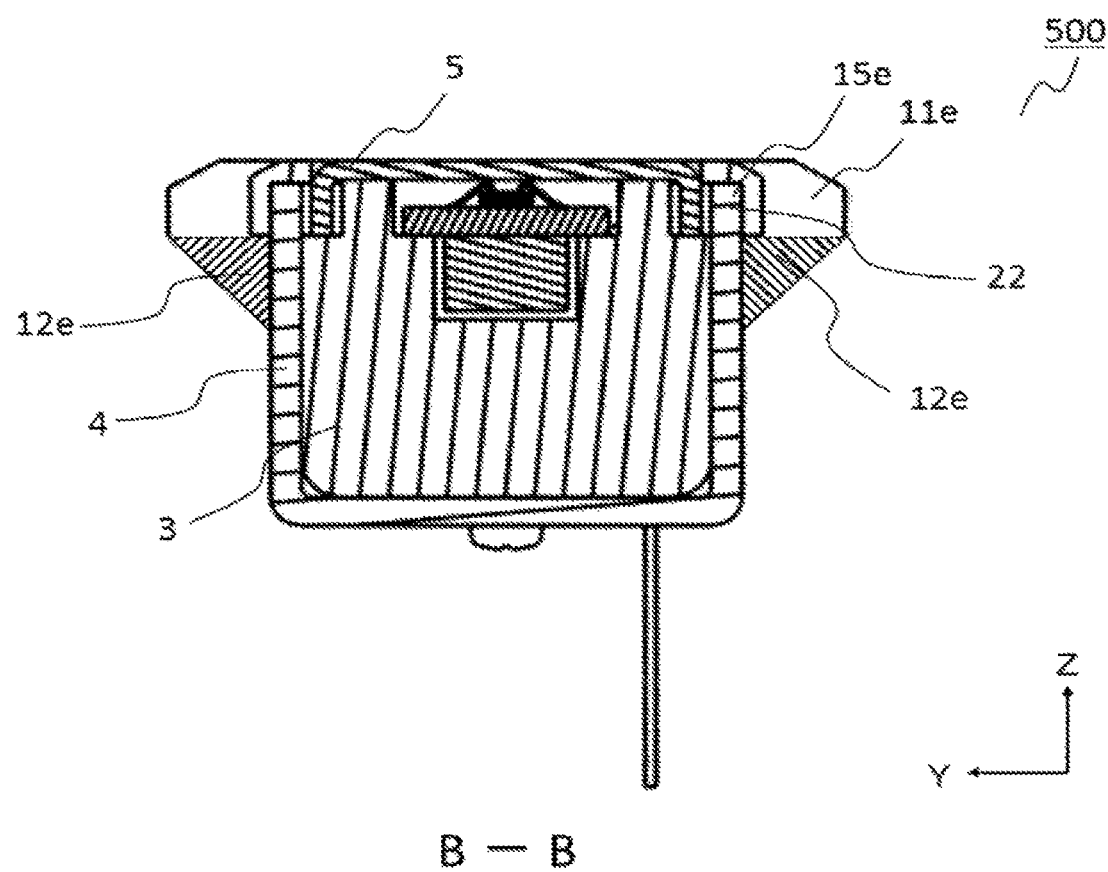
FIG. 23 is a cross-sectional view of a portion of the magnetic sensor device lacking the comb-teeth portions according to Embodiment 5 of the present disclosure

FIG. 23 is a cross-sectional view (taken along B-B in FIG. 20C) of a portion of the magnetic sensor device 500 lacking the comb-teeth portions 11 according to Embodiment 5, as seen from the main scanning direction. At the end portions 22 of the magnetic shield case 4 with respect to the conveying direction 21, projections 15e are formed to extend along the main scanning direction and to project toward the conveying path 14 beyond the conveying path 14-side face of the support members 12e. Second grooves 16e are formed in portions of the cover 5 that are in contact with the projections 15e, whereby the projections 15e are fitted into the second grooves 16e. As a result, the magnetic shield case 4 can be brought closer to the conveying surface, thereby reducing magnetic interference from a direction other than the direction of the conveying surface of the magnetic sensor 3.

The second grooves 16e and the projections 15e may not necessarily be provided. In this case, the portion where the support member 12e is not formed at the end portion 22 of the magnetic shield case 4 with respect to the conveying direction 21 is supported not by being fitted into the cover 5 but by being in contact with the cover 5.

The magnetic sensor device 500 and the housing 2 according to Embodiment 5 of the present disclosure make it possible to easily form the magnetic shield case 4 for the magnetic sensor device 500 and the housing 2.

Figure 24B:
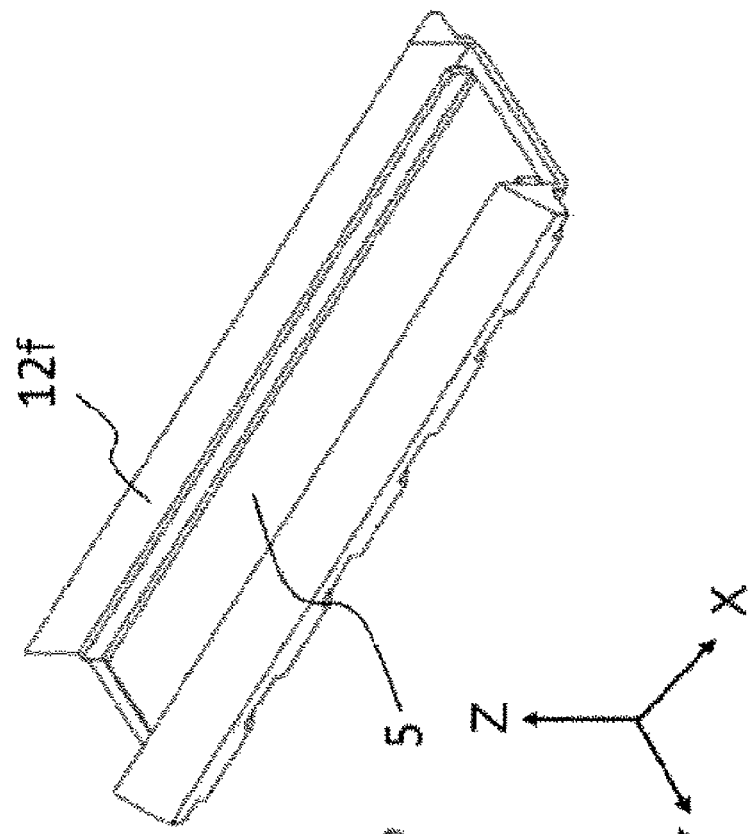
FIG. 24B is a perspective view of (the modified example of) the cover for the magnetic sensor device and the housing according to Embodiment 5 of the present disclosure.
Figure 24A:
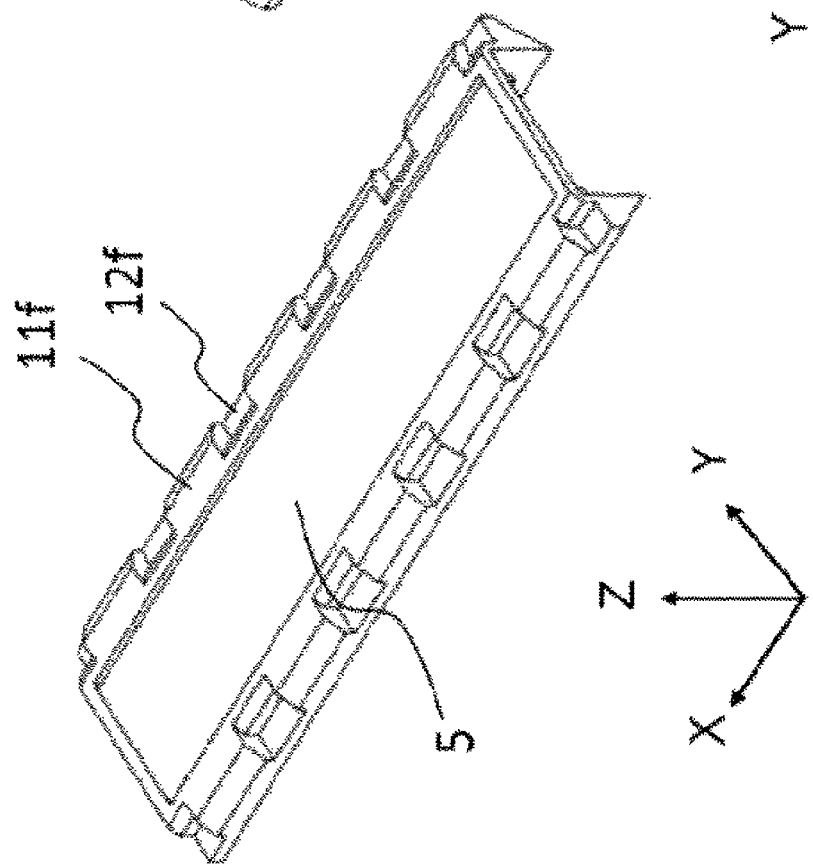
FIG. 24A is a perspective view of (a modified example of) a cover for the magnetic sensor device and the housing according to Embodiment 5 of the present disclosure.

In Embodiment 5 described above, the support members are formed to be suited to the comb-teeth portion 11. However, the support members may be formed to extend along the main scanning direction as in Embodiment 4. As a modified example of Embodiment 5, the magnetic sensor device 500 and the housing 2 including such support members are described below. FIG. 24A and FIG. 24B illustrates a modified example of the magnetic sensor device 500 and the housing 2 according to Embodiment 5. FIG. 24A is a perspective view of the front side of the cover 5 for the magnetic sensor device 500 and the housing 2 according to Embodiment 5, where the front side of the cover 5 corresponds to the conveying path 14-side. FIG. 24B is a perspective view of the back side of the cover 5 for the magnetic sensor device 500 and the housing 2 according to Embodiment 5, where the back side of the cover 5 corresponds to the side opposite to the conveying path 14. As illustrated in FIG. 24A and FIG. 24B, the comb-teeth portions 11 are formed along the main scanning direction at end portions of the cover 5 with respect to the conveying direction 21. The comb-teeth portions 11 include protrusions 11f protruding toward the conveying direction 21 and the protrusions 11f form the shape of comb teeth along the main scanning direction. On faces of the protrusions 11f opposite to the conveying path 14, support members 12f are formed to support the protrusions 11f on the side opposite to the conveying path 14. The support members 12f and the protrusion 11f are integrally formed. The support members 12f are formed to extend along the main scanning direction at the end portions 22 of the magnetic shield case 4 with respect to the conveying direction 21.

In the magnetic sensor device 500 and the housing 2 as configured above, the support members 12f are formed to extend along the main scanning direction, thereby making it possible to more easily form the magnetic shield case 4 for the magnetic sensor device 500 and the housing 2 according to Embodiment 5.

REFERENCE SIGNS LIST

2 Housing
3 Magnetic sensor
4 Magnetic shield case
5 Cover
6 Sensor board
61 Magnetic sensor element
62 Wire
7 Magnet
8 Connector
9 Case
10 Metal sheet
11 Comb-teeth portion
11a, 11b, 11c, 11d, 11e, 11f Protrusion
12a, 12b, 12c, 12d, 12e, 12f Support member
13a, 13c, 13d First groove
14 Conveying path
15a, 15b, 15d, 15e Projection
16a, 16b, 16d, 16e Second groove
20 To-be-detected object
21 Conveying direction
22 End portion
100, 200, 300, 400, 500 Magnetic sensor device

The invention claimed is:
1. A housing comprising:
a magnetic shield case including a space accommodating a magnetic sensor that comprises a magnetic sensor element to detect a magnetic component in a to-be-detected object that is to be conveyed along a conveying path, the magnetic shield case having a magnetic shield case opening that is open toward the conveying path;

a cover supported by an end portion of the magnetic shield case with respect to a conveying direction of the to-be-detected object, the cover covering the magnetic shield case opening;

a comb-teeth portion comprising protrusions at an end portion of the cover with respect to the conveying direction, the protrusions protruding toward the conveying direction and being aligned to form a shape of comb-teeth along an intersecting direction intersecting the conveying direction; and a support member formed on a lateral face of the magnetic shield case along the intersecting direction, the support member supporting the protrusions on the side opposite to the conveying path, wherein the magnetic shield case includes first and second side walls and a bottom wall connecting lower ends of the first and second side walls presenting a generally U-shaped cross section so as to delimit the space accommodating the magnetic sensor, the magnetic shield case has the magnetic shield case opening at a top of the space that is open toward the conveying path, and the support member is formed on a lateral face, at a free upper end of the first side wall, of the magnetic shield case along the intersecting direction.

2. The housing according to claim 1, wherein the support member is formed for the protrusions and projects toward a direction opposite to the conveying path.

3. The housing according to claim 1, wherein the support member is a member formed on the magnetic shield case and projecting toward the conveying direction.

4. The housing according to claim 1, wherein the support member is a member formed at the end portion of the magnetic shield case with respect to the conveying direction and suited to the protrusion.

5. The housing according to claim 1, wherein the support member is a member formed at the end portion of the magnetic shield case with respect to the conveying direction and extending along the intersecting direction.

6. The housing according to claim 1, wherein the magnetic shield case and the support member are integrated.

7. The housing according to claim 1, wherein the protrusion and the support member are integrated.

8. The housing according to claim 1, wherein the cover comprises a groove into which the support member is fitted.

9. The housing according to claim 1, wherein
a projection is formed at the end portion of the magnetic shield case with respect to the conveying direction, the projection projecting toward the conveying path beyond a conveying path-side face of the support member, and
the cover comprises a groove into which the projection is fitted.

10. The housing according to claim 1, wherein the cover is a member in which the comb-teeth portion and a portion covering the magnetic shield case opening are integrated.

11. A magnetic sensor device comprising the housing according to claim 1, wherein
the magnetic sensor is accommodated in the space provided in the housing, and
the magnetic sensor element detects a magnetic component in the to-be-detected object, based on a change in a magnetic field formed in the conveying path.

12. The magnetic sensor device according to claim 11, wherein
the magnetic sensor comprises a case accommodating the magnetic sensor element, and
the case has a case opening that is open toward the conveying path.

13. The magnetic sensor device according to claim 12, wherein the cover covers the case opening.

14. The housing according to claim 2, wherein the protrusion and the support member are integrated.

15. The housing according to claim 7, wherein
a projection is formed at the end portion of the magnetic shield case with respect to the conveying direction, the projection projecting toward the conveying path beyond a conveying path-side face of the support member, and
the cover comprises a groove into which the projection is fitted.

16. The housing according to claim 14, wherein
a projection is formed at the end portion of the magnetic shield case with respect to the conveying direction, the projection projecting toward the conveying path beyond a conveying path-side face of the support member, and
the cover comprises a groove into which the projection is fitted.

17. The housing according to claim 7, wherein the cover is a member in which the comb-teeth portion and a portion covering the magnetic shield case opening are integrated.

18. The housing according to claim 14, wherein the cover is a member in which the comb-teeth portion and a portion covering the magnetic shield case opening are integrated.

19. A magnetic sensor device comprising the housing according to claim 7, wherein
the magnetic sensor is accommodated in the space provided in the housing, and
the magnetic sensor element detects a magnetic component in the to-be-detected object, based on a change in a magnetic field formed in the conveying path.

20. A magnetic sensor device comprising the housing according to claim 14, wherein
the magnetic sensor is accommodated in the space provided in the housing, and
the magnetic sensor element detects a magnetic component in the to-be-detected object, based on a change in a magnetic field formed in the conveying path.

* * * * *